United States Patent
Kodama

(10) Patent No.: US 9,545,035 B2
(45) Date of Patent: Jan. 10, 2017

(54) CONTAINER-TYPE DATA CENTER AND METHOD FOR CONTROLLING CONTAINER-TYPE DATA CENTER

(71) Applicant: FUJITSU LIMITED, Kawasaki-shi, Kanagawa (JP)

(72) Inventor: Hiroyoshi Kodama, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 468 days.

(21) Appl. No.: 14/079,679

(22) Filed: Nov. 14, 2013

(65) Prior Publication Data
US 2014/0206272 A1    Jul. 24, 2014

(30) Foreign Application Priority Data
Jan. 22, 2013 (JP) .................. 2013-009454

(51) Int. Cl.
| | |
|---|---|
| H05K 7/20 | (2006.01) |
| F01P 5/02 | (2006.01) |
| G06F 1/20 | (2006.01) |
| F24F 11/02 | (2006.01) |
| F25B 21/02 | (2006.01) |

(52) U.S. Cl.
CPC ...... H05K 7/20836 (2013.01); H05K 7/20745 (2013.01)

(58) Field of Classification Search
CPC ................................. H05K 7/20836
USPC .......................... 454/184; 361/695
See application file for complete search history.

(56) References Cited

U.S. PATENT DOCUMENTS

| | | | | |
|---|---|---|---|---|
| 7,294,980 | B2 * | 11/2007 | Ma | F04D 25/166 318/111 |
| 8,331,086 | B1 * | 12/2012 | Meissner | H05K 7/20736 312/223.2 |
| 2005/0122680 | A1 * | 6/2005 | Ozawa | H05K 7/207 361/679.49 |
| 2009/0059522 | A1 | 3/2009 | Katakura et al. | |

(Continued)

FOREIGN PATENT DOCUMENTS

| | | |
|---|---|---|
| JP | 08-29210 | 2/1996 |
| JP | 11-28569 | 2/1999 |

(Continued)

OTHER PUBLICATIONS

SGI® ICE Cube® Air, The Expandable Modular Data Center, copyright 2011, Silicon Graphics International Corp., http://www.sgi.com/products/data_center/ice_cube_air.

(Continued)

*Primary Examiner* — Gregory Huson
*Assistant Examiner* — Eric Gorman
(74) *Attorney, Agent, or Firm* — Fujitsu Patent Center

(57) ABSTRACT

A container is provided. A rack is provided in the container, and a server is mounted to the rack. A fan unit is provided in the container, and a large-sized fan and first and second small-sized fans of which diameters are smaller than that of the large-sized fan are alternately arranged on an opposing surface of the fan unit opposed to the rack. A CPU temperature sensor measures a temperature of a heat generation component incorporated in the server. A fan operation management unit controls rotation of the large-sized fan and rotation of the first small-sized fan and the second small-sized fan according to the CPU temperature sensor.

8 Claims, 16 Drawing Sheets

(56) References Cited

U.S. PATENT DOCUMENTS

2014/0092549 A1* 4/2014 Kodama ............ H05K 7/20745
361/679.48

FOREIGN PATENT DOCUMENTS

| | | |
|---|---|---|
| JP | 2009-59033 | 3/2009 |
| JP | 2009-180199 A | 8/2009 |
| JP | 2011-238764 A | 11/2011 |
| JP | 2012-177531 A | 9/2012 |

OTHER PUBLICATIONS

Japanese Office Action mailed Aug. 16, 2016 for corresponding Japanese Patent Application No. 2013-009454, with Partial English Translation, 5 pages.

* cited by examiner

500

| CPU TEMPERATURE [°C] | PRESSURE OPERATING POINT | LARGE-SIZED FAN [%] | SMALL-SIZED FAN [%] | SMALL-SIZED FAN [%] |
|---|---|---|---|---|
| 30 TO 45 | E | STOPPED | min | STOPPED |
| 45 TO 60 | D | STOPPED | min | min |
| 60 TO 65 |  | STOPPED | 14.1 (%/°C) | 14.1 (%/°C) |
| 65 TO 67 | B | 1.8 (%/°C) | | |
| 67 TO 83 | C | 1.8 (%/°C) | STOPPED | STOPPED |
| 83 TO 93 |  | | STOPPED | STOPPED |
| 93 TO 103 |  | 5.0 (%/°C) | STOPPED | STOPPED |
| 103 | A | 5.0 (%/°C) | STOPPED | STOPPED |

| MEMORY TEMPERATURE [°C] | PRESSURE OPERATING POINT | LARGE-SIZED FAN [%] | SMALL-SIZED FAN [%] | SMALL-SIZED FAN [%] |
|---|---|---|---|---|
| 30 TO 45 | E | STOPPED | min | STOPPED |
| 45 TO 60 | D | STOPPED | min | min |
| 60 TO 65 | | STOPPED | 14.1 (%/°C) | 14.1 (%/°C) |
| 65 TO 67 | B | 1.8 (%/°C) | 14.1 (%/°C) | 14.1 (%/°C) |
| 67 TO 83 | C | 1.8 (%/°C) | STOPPED | STOPPED |
| 83 TO 93 | | 1.8 (%/°C) | STOPPED | STOPPED |
| 93 TO 103 | | 5.0 (%/°C) | STOPPED | STOPPED |
| 103 | A | 5.0 (%/°C) | STOPPED | STOPPED |

| POWER SUPPLY TEMPERATURE [°C] | PRESSURE OPERATING POINT | LARGE-SIZED FAN [%] | SMALL-SIZED FAN [%] | SMALL-SIZED FAN [%] |
|---|---|---|---|---|
| 30 TO 50 | E | STOPPED | min | STOPPED |
| 50 TO 70 | D | STOPPED | min | min |
| 70 TO 75 |  | STOPPED | 14.1 (%/°C) | |
| 75 TO 77 | B | 5.0 (%/°C) | | |
| 77 TO 85 | C | | STOPPED | |
| 85 TO 95 | | | | |
| 95 | A | | | |

…

CONTAINER-TYPE DATA CENTER AND METHOD FOR CONTROLLING CONTAINER-TYPE DATA CENTER

CROSS-REFERENCE TO RELATED APPLICATION

This application is based upon and claims the benefit of priority of the prior Japanese Patent Application No. 2013-009454, filed on Jan. 22, 2013, the entire contents of which are incorporated herein by reference.

FIELD

The embodiments discussed herein are directed to a container-type data center and a method for controlling the container-type data center.

BACKGROUND

A data center is a facility for centrally installing and operating a large amount of hardware including a server and communication equipment. Some of the data centers may be installed as part of an existing building. In recent years, cloud services have been developed and a scale of the data center has been continuously increasing. It is desired to achieve further power saving in a large-scale data center.

To construct such a large-scale data center, a container-type data center of which initial investment cost is low is proposed. The container-type data center is a portable data center that can be additionally installed according to a whole scale of the data center, and has an effective configuration to reduce total power consumption and realize power saving, so that it has been rapidly spreading.

Examples of equipment installed in such a container-type data center include network devices, storage devices, and computers such as servers. Some of the equipment installed in the data center include heat generation components such as a central processing unit (CPU) as an arithmetic processing unit or a memory as a storage device. The temperatures of these components that have risen are reduced by air conditioning. This reduces in turn the temperature in the container.

Examples of an air conditioning system of the container-type data center include an air conditioner system using a chiller. When the air conditioner system is used, air is cooled by using electric power. Therefore, there is a risk that a power consumption amount increases in the air conditioner system. Accordingly, an outside-air cooling system has been focused on in terms of power saving of the air conditioning. Specifically, a direct outside-air system, which is one of the air conditioning systems effective for power saving, takes outside air in the container-type data center to lower the temperature of a heat generating component such as a CPU or of a container using the outside air.

As the direct outside-air system, proposed is a related art in which air is sucked in from the outside of the container using a large air conditioning fan mounted to the container and a server takes the air into its housing its own fan to cool a heat generation component and the like (for example, refer to a product catalogue of SGI® IceCube™ Air, SGI Japan, Ltd.).

In such a container-type data center using the direct outside-air system, a plurality of fans that can provide a sufficient volume of air for cooling the server are arranged. Because two or more fans are arranged, redundancy of the fans may be secured.

Example of the cooling fan for the electronic equipment include a related-art configuration including a fan that cools the entire electronic equipment and a fan that locally cools the electronic equipment (for example, refer to Japanese Laid-open Patent Publication No. 2009-59033). In addition, there is a related art for causing temperature-controlled air to flow through equipment to be measured and evaluates a heat radiation characteristic of the equipment (for example, refer to Japanese Laid-open Patent Publication No. 08-29210). There is also a related art for detecting a current value of a power conversion circuit in a welding machine to select the minimum number of fans needed (for example, refer to Japanese Laid-open Patent Publication No. 11-28569).

However, the fan operates by pulse driving, whereby the fan rotates at the minimum number of revolutions by the pulse driving or more. When the largest possible fan is used for saving power, even if the fan rotates at the minimum number of revolutions, the volume of air becomes excessive, for example, in a case where all of the servers are in an idle state. This means that electric power is wasted. When some of the fans are stopped to adjust the volume of air, wind is not sent to some areas. Accordingly, face wind speed cannot be obtained uniformly on a rack on which the server is disposed.

Even when using the related art including the fan that cools the entire electronic equipment and a fan that locally cools the electronic equipment, it is difficult to reduce the excessive volume of air caused at the minimum number of revolutions. When using the related art for causing the temperature-controlled air to flow through the equipment to be measured, the volume of air can be adjusted in a range of the minimum number of revolutions or more, but the volume of air cannot be reduced to or below the volume of air at the minimum number of revolutions. In addition, even when using the related art for selecting the minimum number of fans needed based on the current value, the uniform face wind speed cannot be obtained because the number of fans to be used is reduced.

SUMMARY

According to an aspect of an embodiment, a container-type data center includes a container; a rack that is included in the container and incorporates electronic equipment; a fan device that is included in the container and includes a first fan and one or more second fans of which diameter is smaller than the diameter of the first fan, the first fan and the second fans being alternately arranged on an opposing surface opposed to the rack; a temperature measurement unit that measures a temperature of a heat generation component incorporated in the electronic equipment; and a control unit that controls rotation of the first fan and rotation of the second fans based on the measured temperature.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 13 illustrates an example of a fan control table based on the memory temperature;

DESCRIPTION OF EMBODIMENTS

H Preferred embodiments of the present invention will be explained with reference to accompanying drawings. The container-type data center and the method for controlling the container-type data center disclosed herein are not limited by the embodiments described below.

[a] First Embodiment

Figure 1:
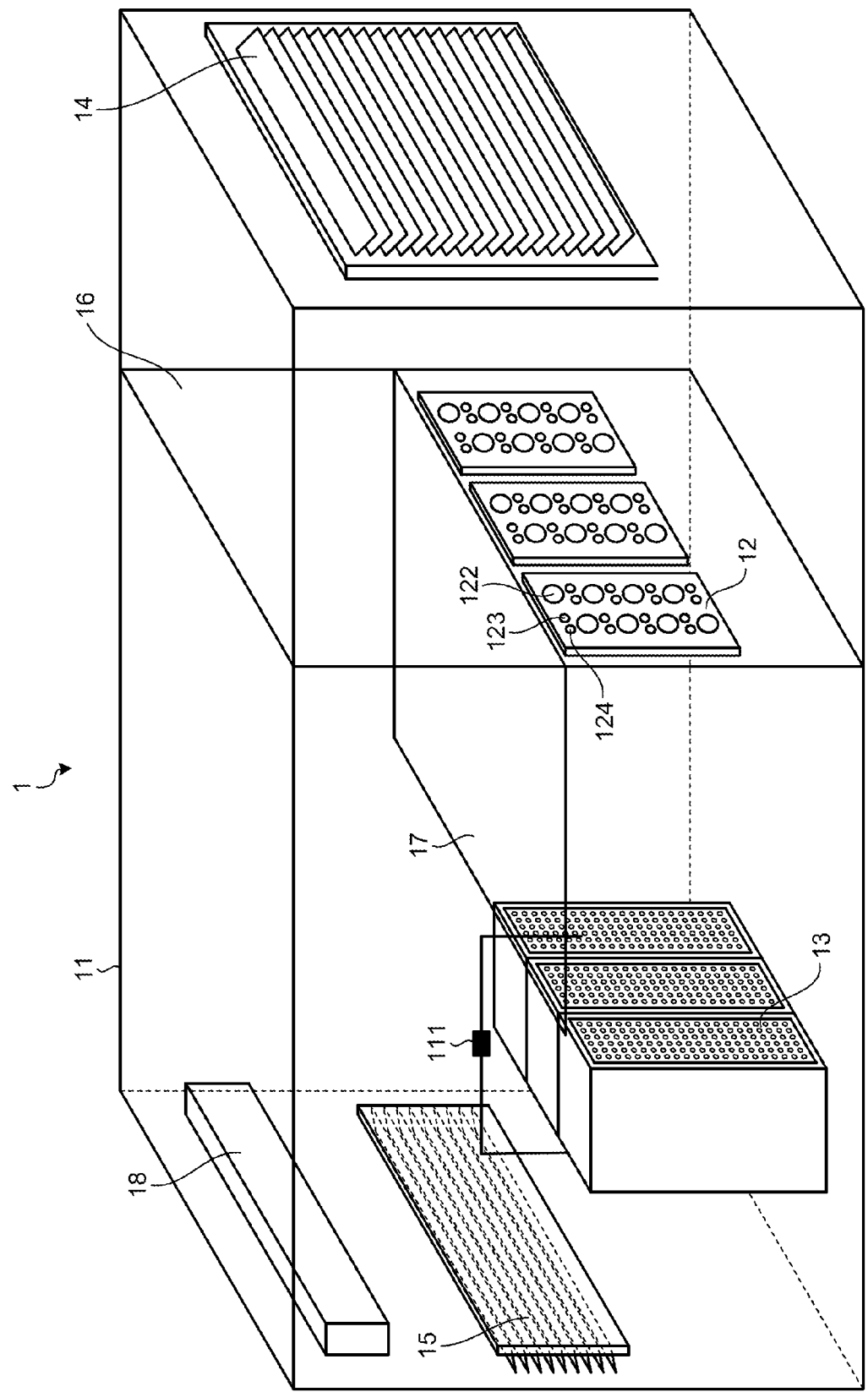
FIG. 1 is a schematic configuration diagram of a container-type data center.

FIG. 1 is a schematic configuration diagram of a container-type data center. In FIG. 1, a configuration other than a portion used for describing a first embodiment is not illustrated. For example, a duct connecting a cold area and a hot area and the like are not illustrated.

This container-type data center 1 includes a fan unit 12, a rack 13, an outside air introducing port 14, an exhaust port 15, a partition plate 16, a partition plate 17, and a power panel 18 that are arranged in a container 11.

In the container 11, the rack 13, the partition plate 16, and the partition plate 17 form a cold aisle that is a space for accommodating cold air sucked by a server mounted on the rack 13 and a hot aisle that is a space for accommodating exhaust heat from the server mounted on the rack 13. In FIG. 1, the cold aisle is formed as a space on the right side of the partition plate 16 and a space on the right side of the rack 13 and below the partition plate 17. A hot aisle is formed as a space on the left side of the rack 13 and a space on the left side of the partition plate 16 and above the partition plate 17.

For example, the rack 13 includes a plurality of pieces of electronic equipment such as a server, a switch, and a storage mounted therein. In FIG. 1, a server, a switch, a storage, and the like are not illustrated because they are stored in the rack 13. Specifically, in the first embodiment, a server that manages each server or each fan (hereinafter, referred to as a "management server") and a server that performs actual processing other than the management server are mounted to the rack 13. Hereinafter, when the term "server" is simply used, it refers to a server other than the management server.

Electric power systems that supply electric power to the server in the rack 13 or the fan unit 12 are concentrated on the power panel 18. The power panel 18 receives electric power from the outside. Then the power panel 18 supplies the electric power to the electronic equipment such as a server or the fan unit 12 using each of the electric power systems. The electronic equipment such as a server or the fan unit 12 operates by using the electric power supplied from the power panel 18.

The outside air introducing port 14 is a port for taking outside air into the cold aisle side in the container 11.

The exhaust port 15 is a port for exhausting air in the hot aisle in the container 11 to the outside.

A plurality of large-sized fans 122, first small-sized fans 123, and second small-sized fans 124 are mounted to the fan unit 12. The fan unit 12 is opposed to a face toward the X direction of the rack 13. That is, the fan unit 12 is arranged in parallel with the Y-Z plane of the coordinates illustrated in FIG. 1.

The air sent by the large-sized fan 122, the first small-sized fan 123, and the second small-sized fan 124 is heated by taking heat from a CPU or a memory incorporated in the server. Then the heated air is discharged to the hot aisle side in the container 11. The air on the hot aisle side is discharged to the outside through the exhaust port 15.

Next, the large-sized fan 122, the first small-sized fan 123, and the second small-sized fan 124 mounted in the fan unit 12 will be described in detail.

Figure 2:
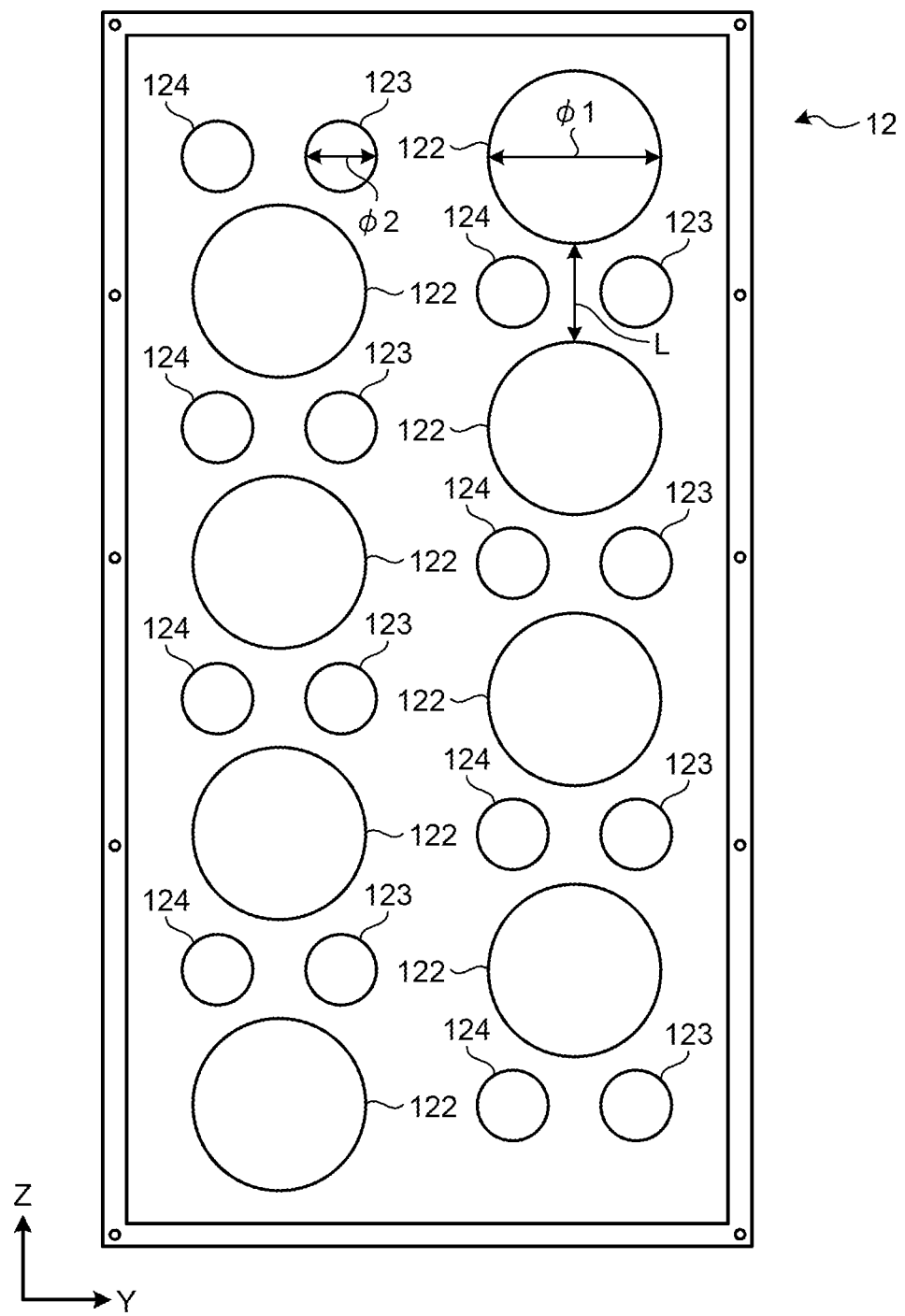
FIG. 2 is a front view of a fan unit.

FIG. 2 is a front view of the fan unit. FIG. 2 is a diagram viewed in the X direction in FIG. 1. The volume of air of the first small-sized fan 123 and the second small-sized fan 124 is smaller than that of the large-sized fan 122. The large-sized fan 122, the first small-sized fan 123, and the second small-sized fan 124 are examples of a "second fan".

As illustrated in FIG. 2, the fan unit 12 includes two columns in each of which the first small-sized fan 123 and the second small-sized fan 124 aligned in the Y direction and the large-sized fan 122 are alternately arranged in the Z direction. The fan unit 12 is configured such that each position of the first small-sized fan 123 and the second small-sized fan 124 aligned in the Y direction and a position of the large-sized fan 122 are in staggered columns in the Z direction. Fan unit mounting holes are provided in the vicinity of the outer circumference of the fan unit 12. In the first embodiment, among the small-sized fans arranged in the Y direction, a small-sized fan on the left side is referred to as the first small-sized fan 123 and a small-sized fan on the right side is referred to as the second small-sized fan 124. The first small-sized fan 123 and the second small-sized fan 124 are of the same type.

As described, the large-sized fan 122 and a set of the first small-sized fan 123 and the second small-sized fan 124 are alternately arranged in the Y direction and the Z direction, so that wind can be uniformly sent to an entire surface of the rack 13 opposed to the fan unit 12.

The first embodiment describes a case in which the large-sized fan 122, the first small-sized fan 123, and the second small-sized fan 124 are alternately arranged in the Z direction that is the vertical direction with respect to a bottom surface of the container 11. However, the arrangement of the fans is not limited thereto. For example, the fans may be alternately arranged in a direction deviating from the Z direction. The first embodiment also describes a case in which the large-sized fan 122, the first small-sized fan 123, and the second small-sized fan 124 are alternately arranged in the Y direction that is a direction parallel to the direction along which the racks 13 are arranged. However, the arrangement of the fans is not limited thereto. For example, the fans may be alternately arranged in a direction deviating from the Y direction. That is, it is preferred that each set of the large-sized fan 122, the first small-sized fan 123, and the second small-sized fan 124 aligned in the Y direction may be arranged at a position substantially opposed to each one of a servers 31, and the wind may be uniformly sent to the entire surface of the opposed rack 13.

The diameter $\phi 1$ of the large-sized fan 122 is 200 cm, for example. The diameter $\phi 2$ of the first small-sized fan 123 and the second small-sized fan 124 is 80 cm, for example. The distance L between the large-sized fans 122 in the Z direction is 120 cm. That is, the first small-sized fan 123 and the second small-sized fan 124 are arranged in a space between two large-sized fans 122 arranged in the Z direction. The large-sized fan 122, the first small-sized fan 123, and the second small-sized fan 124 are all driven through a pulse wide modulation (PWM) control. The PWM control is a control method in which energization to a control object is turned on or off in a short cycle, and the number of revolutions of the fan is controlled by a ratio of time of the "ON" state in one cycle. Hereinafter, a rate of revolution of the large-sized fan 122, the first small-sized fan 123, and the second small-sized fan 124 is represented by a duty ratio that is a ratio (percentage) obtained by dividing the time of the "ON" state by time for one cycle. That is, when the duty ratio is large, the number of revolutions increases. When the duty ratio is small, the number of revolutions decreases. When the duty ratio is 100%, the maximum number of revolutions is obtained. A pulse signal that turns on or off the energization has a minimum length of time in the "ON" state. Therefore, the large-sized fan 122, the first small-sized fan 123, and the second small-sized fan 124 have the minimum numbers of revolutions that are the slowest rotation speeds of the fans. Hereinafter, the duty ratios at the time of the minimum numbers of revolutions of the large-sized fan 122, the first small-sized fan 123, and the second small-sized fan 124 is defined as "mini". That is, for the large-sized fan 122, the first small-sized fan 123, and the second small-sized fan 124, the number of revolutions next smallest to that in a stopping state is the number of revolutions of which duty ratio is "mini".

Figure 3A:
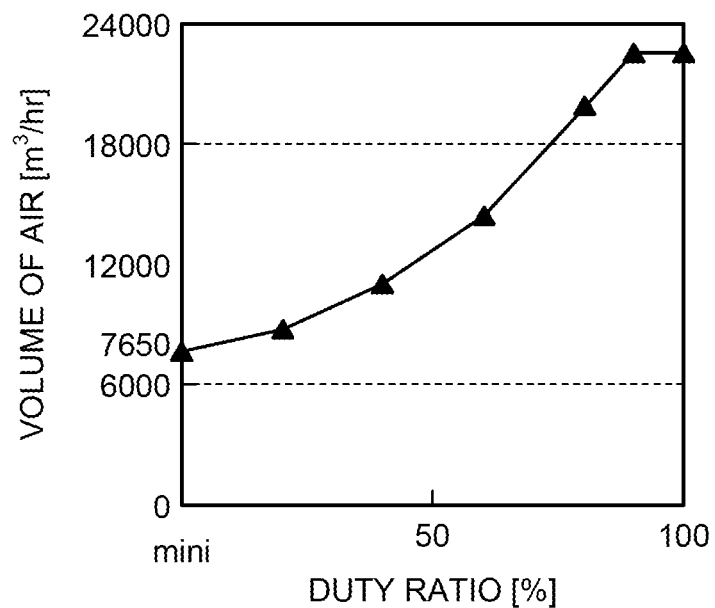
FIG. 3A illustrates a relation between output and a volume of air of a large-sized fan.
Figure 3B:
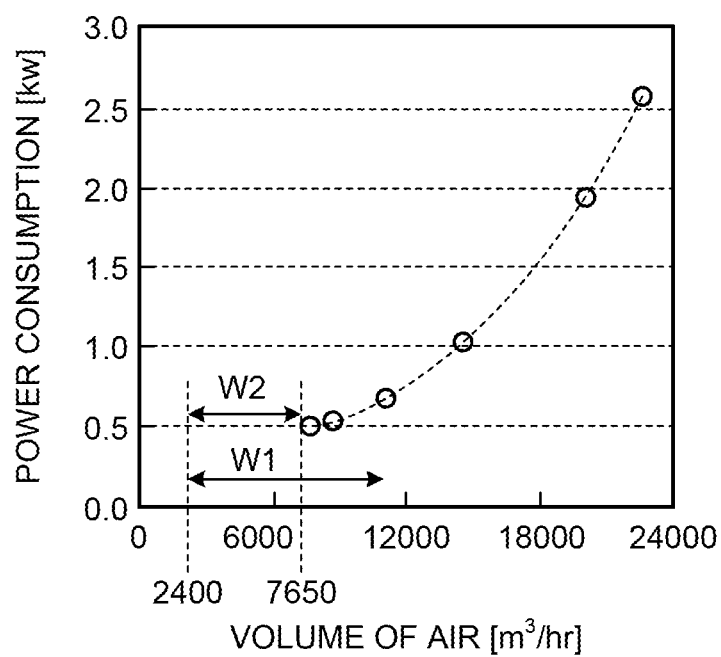
FIG. 3B illustrates a relation between the volume of air and power consumption of the large-sized fan.

As illustrated in FIG. 1, in the first embodiment, the three fan units 12 are provided and eight large-sized fans 122 are mounted to each one of the fan units 12. Therefore, there are twenty-four large-sized fans 122 in the container-type data center 1. Heat generation of the rack 13 is assumed to be 8 kW per rack, so that total heating amount of the rack 13 is 24 kW for three racks. Assuming that a temperature difference between an intake air temperature and an exhaust air temperature is 7 degrees, an object having the heating amount of 24 kW requests a volume of air of 9500 m3/h at the minimum from the three fan units 12. A safety coefficient of 20% is counted in the wind power, so that the volume of air becomes 12000 m3/h. In addition, because it is difficult to determine ventilation resistance, a fan that provides a volume of air that is 120 to 150% of 12000 m3/h when all of the twenty-four fans are driven at the duty ratio of 100% is used as the large-sized fan 122. The volume of air of the large-sized fan 122 determined as described above is given in FIG. 3A. FIG. 3A illustrates a relation between the power and the volume of air of the large-sized fan. As illustrated in FIG. 3A, when the duty ratio is "mini", the volume of air of the large-sized fan 122 is 7650 m3/h. The power consumption of the large-sized fan 122 is given in FIG. 3B. FIG. 3B illustrates a relation between the volume of air and the power consumption of the large-sized fan.

When all the servers are in the idle state, the heating amount of the three racks 13 is about 6 kW, which is about ¼ of the heating amount in a state where all the servers operate. Therefore, when all the servers are in the idle state, the volume of air needed is 9500/4=2400 m3/h at least. However, in such a case, a range W1 of an actual volume of air for the three racks 13 is from 2400 m3/h to 9500 m3/h inclusive. However, the minimum volume of air of the large-sized fan 122 is 7650 m3/h, so that the volume of air in a range W2 in FIG. 3B cannot be obtained. Accordingly, when the large-sized fan 122 is used, the volume of air larger than the requested volume of air in the range W2 is provided, so that excessive power consumption occurs. The volume of air in the range that cannot be supported by the large-sized fan 122 is compensated by using the first small-sized fan 123 and the second small-sized fan 124 as described below.

Figure 4:
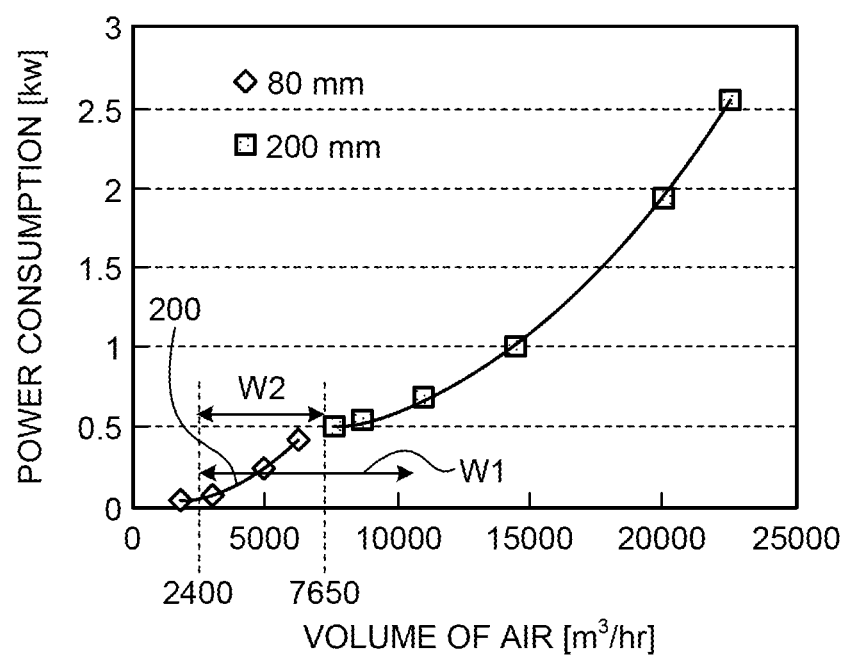
FIG. 4 illustrates a relation between the volume of air and the power consumption of a small-sized fan and the large-sized fan.

The minimum volume of air of each of the first small-sized fan 123 and the second small-sized fan 124 is 0.71 m3/min, and the maximum volume of air thereof is 2.45 m3/min. As illustrated in FIG. 2, forty-two of the first small-sized fans 123 and the second small-sized fans 124 are mounted in one fan unit 12. The first small-sized fans 123 and the second small-sized fans 124 have in total the minimum volume of air of 1789 m3/min and the maximum volume of air of 6176 m3/min. The minimum volume of air satisfies 2400 m3/h that is the requested volume of air when all the servers are in the idle state. A relation between the power consumption and the volume of air of the first small-sized fan 123 and the second small-sized fan 124 is overlapped with the graph of the large-sized fan 122 to have FIG. 4. The graph 200 represents the relation between the power consumption and the volume of air of the first small-sized fan 123 and the second small-sized fan 124. In this manner, the container-type data center 1 according to the first embodiment covers the range of the requested volume of air by simultaneously using the first small-sized fan 123 and the second small-sized fan 124, and the large-sized fan 122. FIG. 4 illustrates a relation between the volume of air and the power consumption of the small-sized fan and the large-sized fan.

As described above, according to the first embodiment, it is understood that the range of the requested volume of air may be covered by using the large-sized fan 122, the first small-sized fan 123, and the second small-sized fan 124. Next, a control of each fan will be described.

Figure 5:
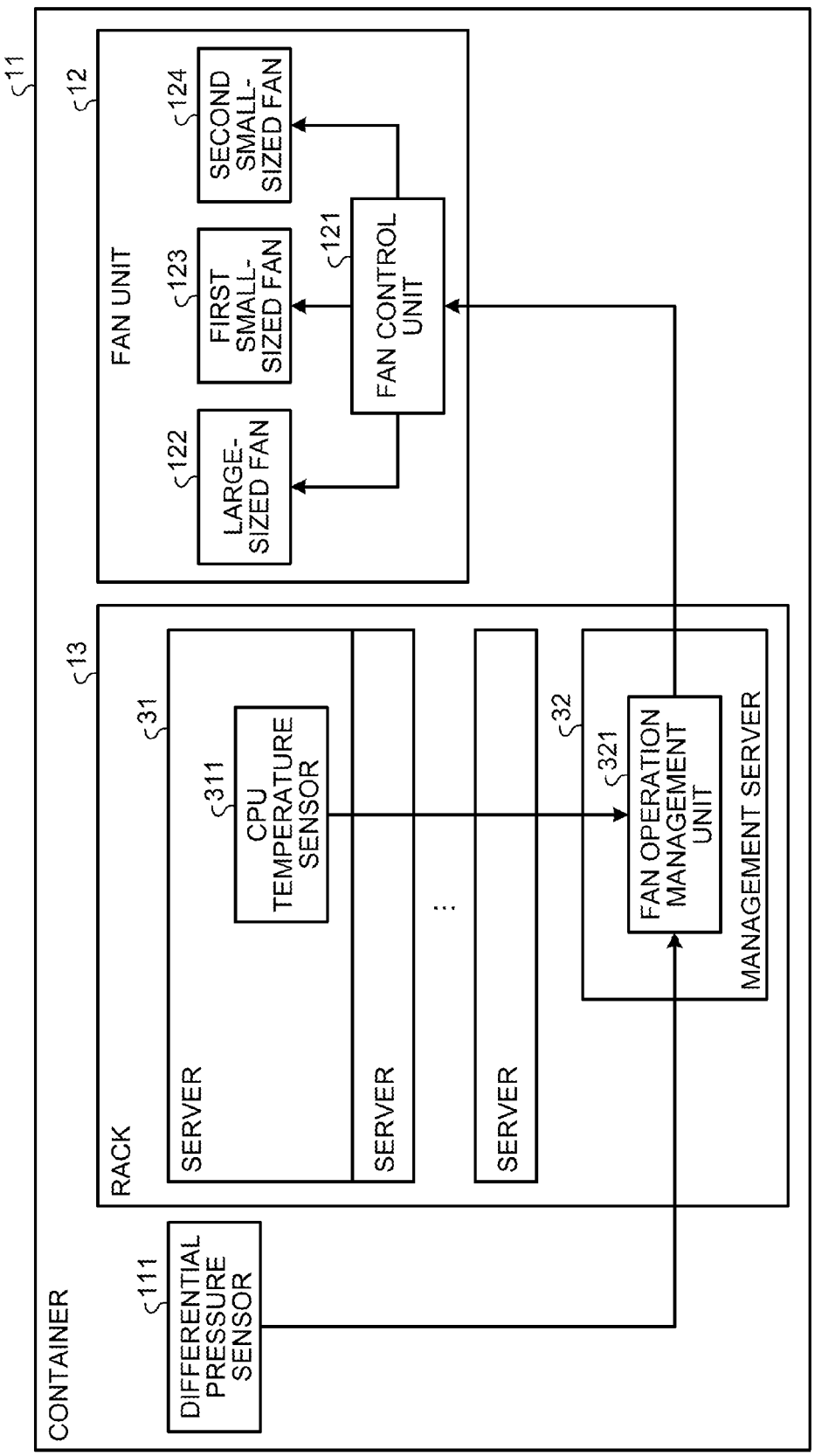
FIG. 5 is a block diagram of a container-type data center according to a first embodiment.

FIG. 5 is a block diagram of the container-type data center according to the first embodiment. For example, as illustrated in FIG. 5, the server 31 and a management server 32 are arranged in the rack 13 mounted to the container-type data center 1 according to the first embodiment. Although one server 31 is illustrated in FIG. 5, a plurality of servers 31 may be mounted thereto. The server 31 is an example of "electronic equipment". A plurality of racks 13 may be provided. A fan control unit 121, the large-sized fan 122, the first small-sized fan 123, and the second small-sized fan 124 are mounted to the fan unit 12 included in the container-type data center 1. The container-type data center 1 includes a differential pressure sensor 111 that measures a pressure difference between the cold aisle side and the hot aisle side of the rack 13.

The differential pressure sensor 111 measures the pressure difference between the fan unit 12 side, that is the cold aisle side, and the exhaust port 15 side, that is the hot aisle side, of the rack 13. The differential pressure sensor 111 calculates a differential pressure by subtracting the pressure on the hot aisle side from the pressure on the cold aisle side. Herein, the differential pressure will be described. In the server 31 mounted in the rack 13, the air on the cold aisle side is sent to the hot aisle side so as to cool a CPU or a memory. Therefore, it is preferred that the pressure on the cold aisle side is higher than the pressure on the hot aisle side in the rack 13. That is, it is preferred that the differential pressure measured by the differential pressure sensor 111 is positive.

The server 31 includes a CPU temperature sensor 311. The CPU temperature sensor 311 measures a temperature of the CPU mounted to the server 31. When there are a plurality of CPUs, the CPU temperature sensor 311 measures the CPU temperature of each CPU. Then the CPU temperature sensor 311 outputs the measurement result to a fan operation management unit 321 of the management server 32 to be described later. The CPU temperature sensor 311 is an example of a "temperature measurement unit".

The management server 32 includes the fan operation management unit 321. The fan operation management unit 321 receives an input of a measurement result of a differential pressure between the pressure on the cold aisle side and the pressure on the hot aisle side in the rack 13 from the differential pressure sensor 111. The fan operation management unit 321 also receives an input of the CPU temperature in the server 31 from the CPU temperature sensor 311.

Figures 6, 7:
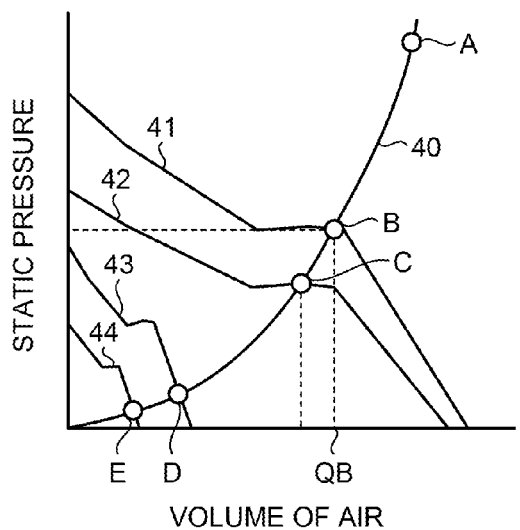
FIG. 6 illustrates an example of a fan control table based on CPU temperature.
FIG. 7 illustrates an optimum operating point of each fan.

The fan operation management unit 321 stores therein a fan control table 500 as illustrated in FIG. 6. FIG. 6 illustrates an example of the fan control table based on CPU temperatures. The fan operation management unit 321 transmits to the fan control unit 121 an instruction for operating the fan according to the CPU temperature by referring to the fan control table 500. Specifically, the fan operation management unit 321 transmits the duty ratio of each fan to the fan control unit 121. When there are a plurality of CPUs, the fan operation management unit 321 controls the fan based on the highest CPU temperature. Hereinafter, the highest CPU temperature referred to by the fan operation management unit 321 is simply referred to as a "CPU temperature". The "fan operation management unit" and the "fan control unit" are examples of the control unit.

Figure 8:
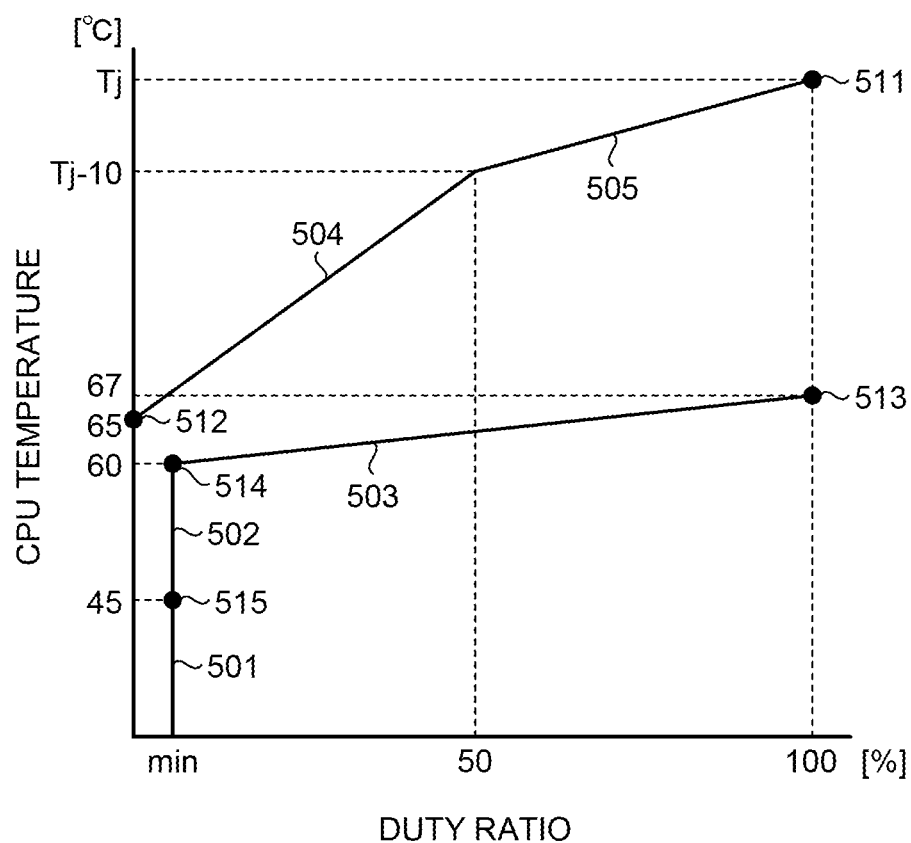
FIG. 8 illustrates a relation between a CPU temperature and a duty ratio.

The fan control table 500 will be described with reference to FIG. 7 and FIG. 8. FIG. 7 illustrates an optimum operating point of each fan. FIG. 8 illustrates a relation between the CPU temperature and the duty ratio. In FIG. 7, the vertical axis represents a static pressure and the horizontal axis represents the volume of air. In FIG. 8, the vertical axis represents the CPU temperature and the horizontal axis represents the duty ratio. Hereinafter, the large-sized fan 122, the first small-sized fan 123, and the second small-sized fan 124 are simply referred to as a "fan" unless they are specifically discriminated.

A graph 40 in FIG. 7 represents a resistance loss curve of the server 31. A graph 41 represents PQ characteristics when the duty ratio of the large-sized fan 122 is "mini" for the minimum number of revolutions. A graph 42 represents the PQ characteristics when the duty ratios of the first small-sized fan 123 and the second small-sized fan 124 are both 100% for the maximum number of revolutions. A graph 43 represents the PQ characteristics when the duty ratios of the first small-sized fan 123 and the second small-sized fan 124 are both "mini" for the minimum number of revolutions. A graph 44 represents the PQ characteristics when only the first small-sized fan 123 rotates at the duty ratio of "mini" and the second small-sized fan 124 is stopped.

An operating point B that is an intersection point of the graph 40 and the graph 41 is an operating point when the duty ratio of the large-sized fan 122 is "mini". The operating point represents the volume of air flowing from a fan of which PQ characteristics is specified to a server of which resistance loss curve is specified. For example, when the duty ratio of the large-sized fan 122 is "mini", wind of which the volume of air is QB m3/h corresponding to the operating point B flows to the server 31. An operating point C that is an intersection point of the graph 40 and the graph 42 is an operating point when the duty ratios of the first small-sized fan 123 and the second small-sized fan 124 are both 100%. An operating point D that is an intersection point of the graph 40 and the graph 43 is an operating point when the duty ratios of the first small-sized fan 123 and the second small-sized fan 124 are both "mini". An operating point E that is an intersection point of the graph 40 and the graph 44 is an operating point when only the first small-sized fan 123 rotates at the duty ratio of "mini". An operating point A is an operating point when the duty ratio of the large-sized fan 122 is 100% for the maximum number of revolutions.

When the CPU temperature is less than 45° C., it is preferred that the volume of air is the one at the operating point E. That is, as the volume of air at a point 515 in FIG. 8, the volume of air at the operating point E is requested. When the CPU temperature is 45° C. or more and less than 60° C., it is preferred that the volume of air is the one at the operating point D. That is, as the volume of air at a point 514, the volume of air at the operating point D is requested. When the CPU temperature is 67° C., it is preferred that the volume of air is the one at the operating point C. That is, as the volume of air at a point 513, the volume of air at the operating point C is requested. Therefore, the first small-sized fan 123 and the second small-sized fan 124 are preferably controlled so that the duty ratio varies as represented by graphs 501 to 503 in FIG. 8. That is, the point 515 is a switching point between the volume of air at the operating point E and the volume of air at the operating point D so that the volume of air at the operating point E is obtained at the temperature of less than 45° C. and the volume of air at the operating point D is obtained at the temperature of 45° C. or more and less than 60° C. That is, only the first small-sized fan 123 rotates at the duty ratio of "mini" in the graph 501, and the first small-sized fan 123 and the second small-sized fan 124 rotate at the duty ratio of "mini" in the graph 502. The duty ratio of the first small-sized fan 123 and the second small-sized fan 124 gradually increases from the point 514 so that the duty ratio becomes 100% at the point 513 of 67° C. in order to obtain the volume of air at the operating point C at 67° C. That is, during that period, it is preferred that the duty ratio of the first small-sized fan 123 and the second small-sized fan 124 varies as represented by the graph 503. As described later, when the CPU temperature is 67° C. or more, the large-sized fan 122 is already rotating. Therefore, it is preferred that the first small-sized fan 123 and the second small-sized fan 124 are stopped in view of power saving.

When the CPU temperature is 65° C., it is preferred that the volume of air is the one at the operating point B. That is, as the volume of air at a point 512, the volume of air at the operating point B is requested. When the CPU temperature is Tj that is an upper limit value, it is preferred that the volume of air is the one at the operating point A. That is, as the volume of air at a point 511, the volume of air at the operating point A is requested. Tj represents T junction, which is the upper limit value of the CPU temperature. However, it is preferred that the duty ratio of 50% is obtained at Tj−10° C. Therefore, the large-sized fan 122 is preferably controlled so that the duty ratio varies as represented by graphs 504 and 505 in FIG. 8. That is, the large-sized fan 122 rotates at the duty ratio of "mini" at 65° C. so that the volume of air at the operating point B is obtained. Then the duty ratio of the large-sized fan 122 increases from the point 512 so that the duty ratio becomes 50% at Tj−10° C. That is, during that period, it is preferred that the duty ratio of the large-sized fan 122 varies as represented by the graph 504. When the CPU temperature is Tj, the duty ratio of the large-sized fan 122 increases from 50% at Tj−10° C. to the point 511 so that the duty ratio becomes 100%. That is, during that period, it is preferred that the duty ratio of the large-sized fan 122 varies as represented by the graph 505.

According to the first embodiment, the CPU temperature of 45° C. is an example of a "first threshold", 60° C. is an example of a "second threshold", 65° C. is an example of a "third threshold", 67° C. is an example of a "fourth threshold", and 103° C. is an example of a "fifth threshold".

At the temperature of 65° C. or more and less than 67° C., all of the large-sized fan 122, the first small-sized fan 123, and the second small-sized fan 124 send a sufficient volume of wind. This range is provided as a buffer for preventing the wind from being stopped by switching the rotating fans.

The fan control table 500 of FIG. 6 is a table created to implement the operation of the large-sized fan 122, the first small-sized fan 123, and the second small-sized fan 124 illustrated in FIG. 8. The fan control table 500 is a table when Tj is 103° C. In the fan control table 500, the control is described being divided at Tj−20° C. so that the control of the fan in a case of Tj−20° C. is clearly described. However, in the first embodiment, it is possible that the control division at Tj−20° C. in the fan control table 500 is not used.

The fan operation management unit 321 determines the duty ratio of each fan according to the CPU temperature transmitted from the CPU temperature sensor 311 by referring to the fan control table 500. Then the fan operation management unit 321 provides an instruction to the fan control unit 121 so that each fan operates at the determined duty ratio. Hereinafter, the determination of the duty ratio of each fan of the fan operation management unit 321 will be described in detail with reference to FIG. 6. The CPU temperature transmitted from the CPU temperature sensor 311 is assumed to be T° C. Hereinafter, the unit of the duty ratio (%) will be omitted.

When T° C. is less than 45° C., the fan operation management unit 321 determines to stop the large-sized fan 122 and the second small-sized fan 124. In addition, the fan operation management unit 321 sets the duty ratio of the first small-sized fan 123 to be "mini".

When T° C. is 45° C. or more and less than 60° C., the fan operation management unit 321 determines to stop the large-sized fan 122. In addition, the fan operation management unit 321 sets the duty ratio of the first small-sized fan 123 and the second small-sized fan 124 to be "mini".

When T° C. is 60° C. or more and less than 65° C., the fan operation management unit 321 determines to stop the large-sized fan 122. The fan operation management unit 321 sets the duty ratio of the first small-sized fan 123 and the second small-sized fan 124 to be (T−60)×14.1. When T° C. is 60° C., the fan operation management unit 321 sets the duty ratio of the first small-sized fan 123 and the second small-sized fan 124 to be "mini".

When T° C. is 65° C. or more and less than 67° C., the fan operation management unit 321 sets the duty ratio of the large-sized fan 122 to be (T−65)×1.8. In addition, the fan operation management unit 321 sets the duty ratio of the first small-sized fan 123 and the second small-sized fan 124 to be (T−60)×14.1. When T° C. is 65° C., the fan operation management unit 321 sets the duty ratio of the large-sized fan 122 to be "mini".

When T° C. is 67° C. or more and less than 83° C., the fan operation management unit 321 determines to stop the first small-sized fan 123 and the second small-sized fan 124. In addition, the fan operation management unit 321 sets the duty ratio of the large-sized fan 122 to be (T−65)×1.8.

When T° C. is 83° C. or more and less than 93° C., the fan operation management unit 321 determines to stop the first small-sized fan 123 and the second small-sized fan 124. In addition, the fan operation management unit 321 sets the duty ratio of the large-sized fan 122 to be (T−65)×1.8.

When T° C. is 93° C. or more and less than 103° C., the fan operation management unit 321 determines to stop the first small-sized fan 123 and the second small-sized fan 124. In addition, the fan operation management unit 321 sets the duty ratio of the large-sized fan 122 to be 50+(T−93)×5.0.

When T° C. is 103° C. or more, the fan operation management unit 321 determines to stop the first small-sized fan 123 and the second small-sized fan 124. In addition, the fan operation management unit 321 sets the duty ratio of the large-sized fan 122 to be 100. However, because 103° C. is the upper limit value of the CPU temperature, the CPU stops the operation when the CPU temperature exceeds 103° C.

The operation of the fans illustrated in FIG. 6 and FIG. 8 is a typical example. Actually, the rotation of the fans is preferably controlled more finely according to the state of the container-type data center 1 represented by, for example, the differential pressure between the cold aisle and the hot aisle.

The description returns to FIG. 5. The fan unit 12 includes the fan control unit 121, the large-sized fan 122, the first small-sized fan 123, and the second small-sized fan 124.

The fan control unit 121 receives designation of the duty ratios for the rotating large-sized fan 122, the first small-sized fan 123, and the second small-sized fan 124 from the fan operation management unit 321. Then the fan control unit 121 controls rotation of each fan by transmitting a pulse signal to the large-sized fan 122, the first small-sized fan 123, and the second small-sized fan 124 at the designated duty ratios.

The large-sized fan 122, the first small-sized fan 123, and the second small-sized fan 124 receive the pulse signal from the fan control unit 121, rotate according to the pulse signal, and suck outside air into the cold aisle side of the container 11 from the outside air introducing port 14 (refer to FIG. 1). Then the large-sized fan 122, the first small-sized fan 123, and the second small-sized fan 124 send the sucked outside air to the server 31.

Figure 9:
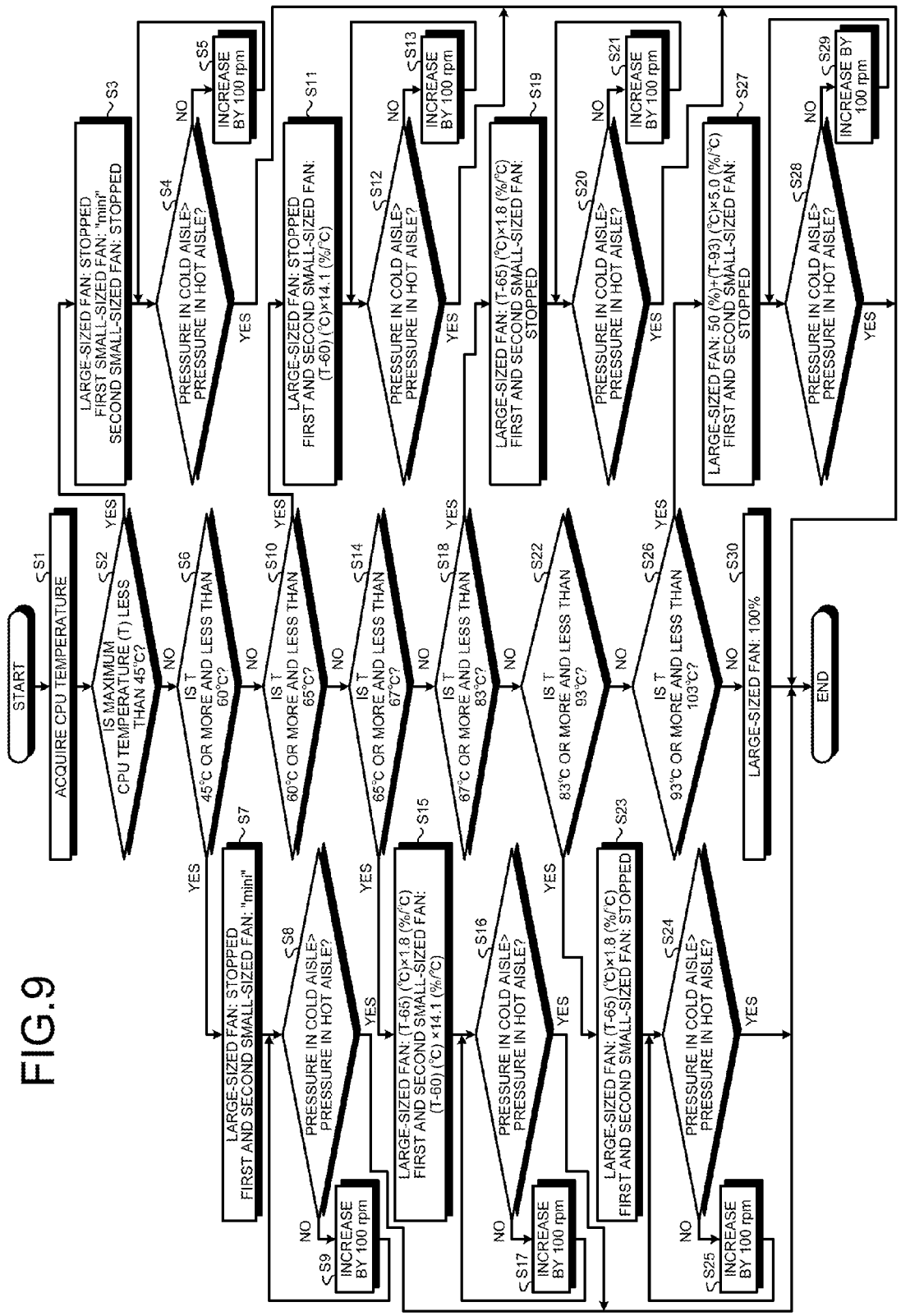
FIG. 9 is a flowchart of control of the fans based on the CPU temperature in the container-type data center according to the first embodiment.

The following describes again the procedure of the control of the fans in the container-type data center according to the first embodiment with reference to FIG. 9. FIG. 9 is a flowchart of the control of the fans based on the CPU temperature in the container-type data center according to the first embodiment. As described above, a pulse is transmitted to rotate each fan according to the duty ratio set by the fan operation management unit 321. However, for the sake of convenience, description is made hereinafter assuming that the fan operation management unit 321 rotates each fan. Herein, described is a case in which the fan operation management unit 321 makes fine adjustment to the number of revolutions of the fan based on the differential pressure between the cold aisle and the hot aisle, in addition to the control of the number of revolutions of the fan by referring to the fan control table 500. FIG. 9 is a flowchart of one control cycle of the fans, and the procedure in FIG. 9 is periodically repeated at two-second intervals, for example.

The fan operation management unit 321 acquires the CPU temperatures from the CPU temperature sensor 311 (Step S1). Then the fan operation management unit 321 selects the maximum CPU temperature (T) from among the acquired CPU temperatures.

The fan operation management unit 321 determines whether the maximum CPU temperature (T) is less than 45° C. (Step S2). When the temperature is less than 45° C. (Yes at Step S2), the fan operation management unit 321 determines to stop the large-sized fan 122 and the second small-sized fan 124. In addition, the fan operation management unit 321 rotates the first small-sized fan 123 at the duty ratio of "mini" (Step S3).

The fan operation management unit 321 acquires the differential pressure between the cold aisle and the hot aisle from the differential pressure sensor 111, and determines whether the pressure in the cold aisle is higher than the pressure in the hot aisle (Step S4). When the pressure in the cold aisle is equal to or lower than the pressure in the hot aisle (No at Step S4), the fan operation management unit 321 increases the number of revolutions of the first small-sized fan 123 by 100 rpm (Step S5). Thereafter, the fan operation management unit 321 returns to Step S4. In contrast, when the pressure in the cold aisle is higher than the pressure in the hot aisle (Yes at Step S4), the fan operation management unit 321 finishes the control of the fans.

When T is 45° C. or more (No at Step S2), the fan operation management unit 321 determines whether the maximum CPU temperature (T) is 45° C. or more and less than 60° C. (Step S6). When T is 45° C. or more and less than 60° C. (Yes at Step S6), the fan operation management unit 321 determines to stop the large-sized fan 122. In addition, the fan operation management unit 321 rotates the first small-sized fan 123 and the second small-sized fan 124 at the duty ratio of "mini" (Step S7).

The fan operation management unit 321 acquires the differential pressure between the cold aisle and the hot aisle from the differential pressure sensor 111, and determines whether the pressure in the cold aisle is higher than the pressure in the hot aisle (Step S8). When the pressure in the cold aisle is equal to or lower than the pressure in the hot aisle (No at Step S8), the fan operation management unit 321 increases the number of revolutions of the first small-sized fan 123 and the second small-sized fan 124 by 100 rpm (Step S9). Thereafter, the fan operation management unit 321 returns to Step S8. In contrast, when the pressure in the cold aisle is higher than the pressure in the hot aisle (Yes at Step S8), the fan operation management unit 321 finishes the control of the fans.

When T is 60° C. or more (No at Step S6), the fan operation management unit 321 determines whether the maximum CPU temperature (T) is 60° C. or more and less than 65° C. (Step S10). When T is 60° C. or more and less than 65° C. (Yes at Step S10), the fan operation management unit 321 determines to stop the large-sized fan 122. In addition, the fan operation management unit 321 rotates the first small-sized fan 123 and the second small-sized fan 124 at the duty ratio of (T−60)×14.1 (Step S11).

The fan operation management unit 321 acquires the differential pressure between the cold aisle and the hot aisle from the differential pressure sensor 111, and determines whether the pressure in the cold aisle is higher than the pressure in the hot aisle (Step S12). When the pressure in the cold aisle is lower than the pressure in the hot aisle (No at Step S12), the fan operation management unit 321 increases the number of revolutions of the first small-sized fan 123 and the second small-sized fan 124 by 100 rpm (Step S13). Thereafter, the fan operation management unit 321 returns to Step S12. In contrast, when the pressure in the cold aisle is higher than the pressure in the hot aisle (Yes at Step S12), the fan operation management unit 321 finishes the control of the fans.

When T is 65° C. or more (No at Step S10), the fan operation management unit 321 determines whether the maximum CPU temperature (T) is 65° C. or more and less than 67° C. (Step S14). When T is 65° C. or more and less than 67° C. (Yes at Step S14), the fan operation management unit 321 rotates the large-sized fan 122 at the duty ratio of (T−65)×1.8. In addition, the fan operation management unit 321 rotates the first small-sized fan 123 and the second small-sized fan 124 at the duty ratio of (T−60)×14.1 (Step S15).

The fan operation management unit 321 acquires the differential pressure between the cold aisle and the hot aisle from the differential pressure sensor 111, and determines whether the pressure in the cold aisle is higher than the pressure in the hot aisle (Step S16). When the pressure in the cold aisle is equal to or lower than the pressure in the hot aisle (No at Step S16), the fan operation management unit 321 increases the number of revolutions of the large-sized fan 122, the first small-sized fan 123, and the second small-sized fan 124 by 100 rpm (Step S17). Thereafter, the fan operation management unit 321 returns to Step S16. In contrast, when the pressure in the cold aisle is higher than the pressure in the hot aisle (Yes at Step S16), the fan operation management unit 321 finishes the control of the fans.

When T is 67° C. or more (No at Step S14), the fan operation management unit 321 determines whether the maximum CPU temperature (T) is 67° C. or more and less than 83° C. (Step S18). When T is 67° C. or more and less than 83° C. (Yes at Step S18), the fan operation management unit 321 rotates the large-sized fan 122 at the duty ratio of (T−65)×1.8. In addition, the fan operation management unit 321 stops the first small-sized fan 123 and the second small-sized fan 124 (Step S19).

The fan operation management unit 321 acquires the differential pressure between the cold aisle and the hot aisle from the differential pressure sensor 111, and determines whether the pressure in the cold aisle is higher than the pressure in the hot aisle (Step S20). When the pressure in the cold aisle is equal to or lower than the pressure in the hot aisle (No at Step S20), the fan operation management unit 321 increases the number of revolutions of the large-sized fan 122 by 100 rpm (Step S21). Thereafter, the fan operation management unit 321 returns to Step S20. In contrast, when the pressure in the cold aisle is higher than the pressure in the hot aisle (Yes at Step S20), the fan operation management unit 321 finishes the control of the fans.

When T is 83° C. or more (No at Step S18), the fan operation management unit 321 determines whether the maximum CPU temperature (T) is 83° C. or more and less than 93° C. (Step S22). When T is 83° C. or more and less than 93° C. (Yes at Step S22), the fan operation management unit 321 rotates the large-sized fan 122 at the duty ratio of (T−65)×1.8. In addition, the fan operation management unit 321 stops the first small-sized fan 123 and the second small-sized fan 124 (Step S23).

The fan operation management unit 321 acquires the differential pressure between the cold aisle and the hot aisle from the differential pressure sensor 111, and determines whether the pressure in the cold aisle is higher than the pressure in the hot aisle (Step S24). When the pressure in the cold aisle is equal to or lower than the pressure in the hot aisle (No at Step S24), the fan operation management unit 321 increases the number of revolutions of the large-sized fan 122 by 100 rpm (Step S25). Thereafter, the fan operation management unit 321 returns to Step S24. In contrast, when the pressure in the cold aisle is higher than the pressure in the hot aisle (Yes at Step S24), the fan operation management unit 321 finishes the control of the fans.

When T is 93° C. or more (No at Step S22), the fan operation management unit 321 determines whether the maximum CPU temperature (T) is 93° C. or more and less than 103° C. (Step S26). When T is 93° C. or more and less than 103° C. (Yes at Step S26), the fan operation management unit 321 rotates the large-sized fan 122 at the duty ratio of 50+(T−93)×5.0. In addition, the fan operation management unit 321 stops the first small-sized fan 123 and the second small-sized fan 124 (Step S27).

The fan operation management unit 321 acquires the differential pressure between the cold aisle and the hot aisle from the differential pressure sensor 111, and determines whether the pressure in the cold aisle is higher than the pressure in the hot aisle (Step S28). When the pressure in the cold aisle is equal to or lower than the pressure in the hot aisle (No at Step S28), the fan operation management unit 321 increases the number of revolutions of the large-sized fan 122 by 100 rpm (Step S29). Thereafter, the fan operation management unit 321 returns to Step S28. In contrast, when the pressure in the cold aisle is higher than the pressure in the hot aisle (Yes at Step S28), the fan operation management unit 321 finishes the control of the fans.

When T is 103° C. or more (No at Step S26), the fan operation management unit 321 rotates the large-sized fan 122 at the duty ratio of 100 (Step S30). Accordingly, the fan operation management unit 321 finishes the control of the fans.

Figure 10:
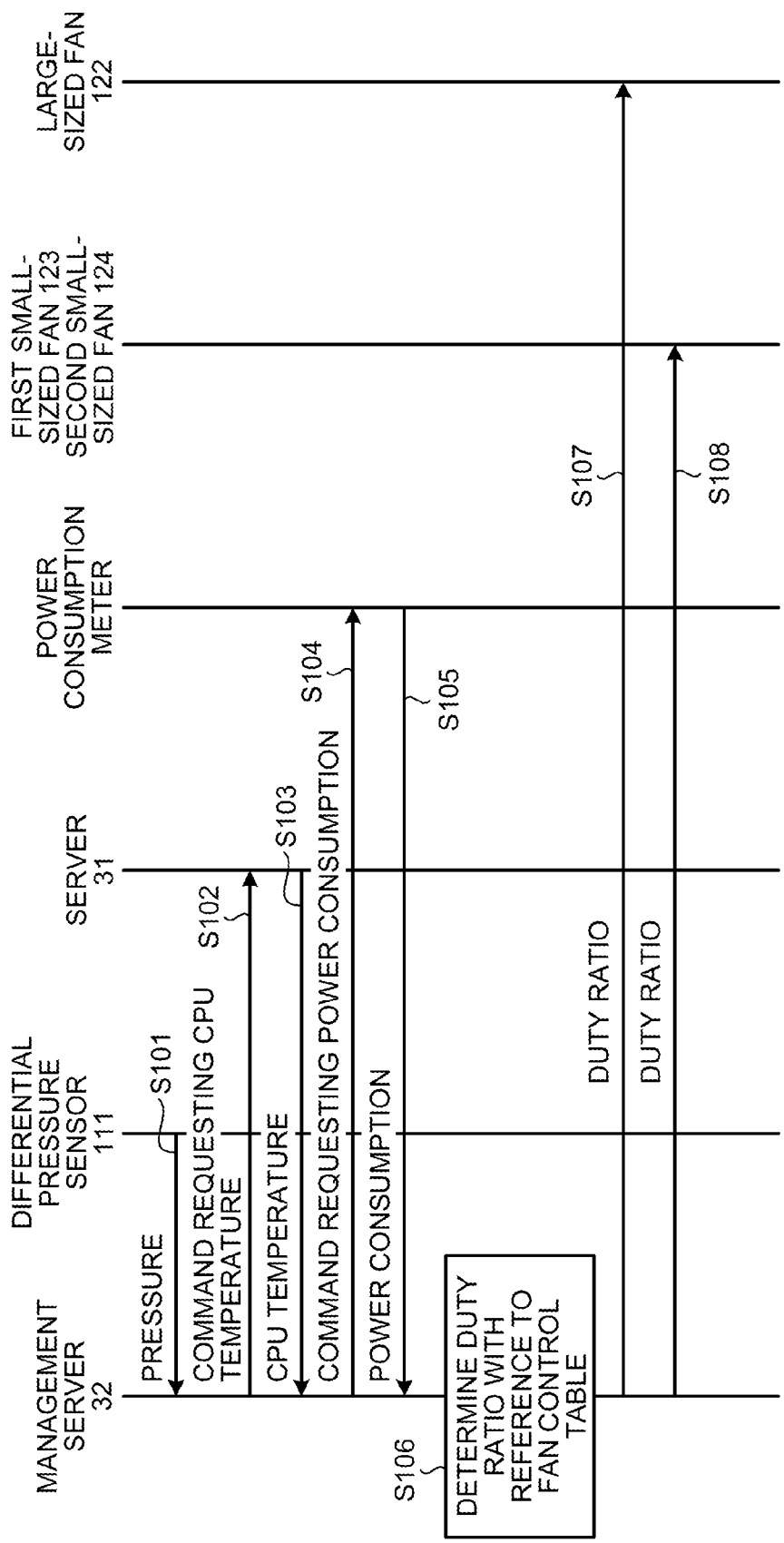
FIG. 10 is a sequence diagram of the control of the fans based on the CPU temperature in the container-type data center according to the first embodiment.

The entire procedure of the control of the fans will be further described with reference to FIG. 10. FIG. 10 is a sequence diagram of the control of the fans based on the CPU temperature in the container-type data center according to the first embodiment. Herein, described is a case in which the container-type data center 1 includes a power consumption meter mounted therein, and the management server 32 also monitors the power consumption.

The differential pressure sensor 111 transmits information of a pressure representing the differential pressure between the cold aisle and the hot aisle to the management server 32 with a Simple Network Management Protocol (SNMP) (Step S101).

Next, the management server 32 transmits a command requesting the CPU temperature to the server 31 (Step S102). The server 31 receives the command from the management server 32 and transmits the measured CPU temperature to the management server 32 with an Intelligent Platform Management Interface (IPMI) (Step S103).

Next, the management server 32 transmits a command requesting the power consumption to the power consumption meter (Step S104). The power consumption meter receives the command from the management server 32 and transmits the measured power consumption of the large-sized fan 122, the first small-sized fan 123, and the second small-sized fan 124 to the management server 32 with the SNMP (Step S105).

The management server 32 refers to the fan control table 500 and determines each duty ratio of the large-sized fan 122, the first small-sized fan 123, and the second small-sized fan 124 (Step S106). Then the management server 32 transmits the determined duty ratio to the fan control unit 121, and rotates the large-sized fan 122 through a pulse at the determined duty ratio (Step S107). And the management server 32 transmits the determined duty ratio to the fan control unit 121, and rotates each of the first small-sized fan 123, and the second small-sized fan 124 through a pulse at the determined duty ratio (Step S108).

As described above, the container-type data center according to the first embodiment cools the server mounted to the rack by controlling the number of revolutions of two types of fans that provide different volumes of air based on the CPU temperature. Accordingly, the volume of air can be appropriately adjusted according to the state of the server and an excessive volume of air is not sent. Therefore, power consumption can be reduced.

[b] Second Embodiment

Figure 11:
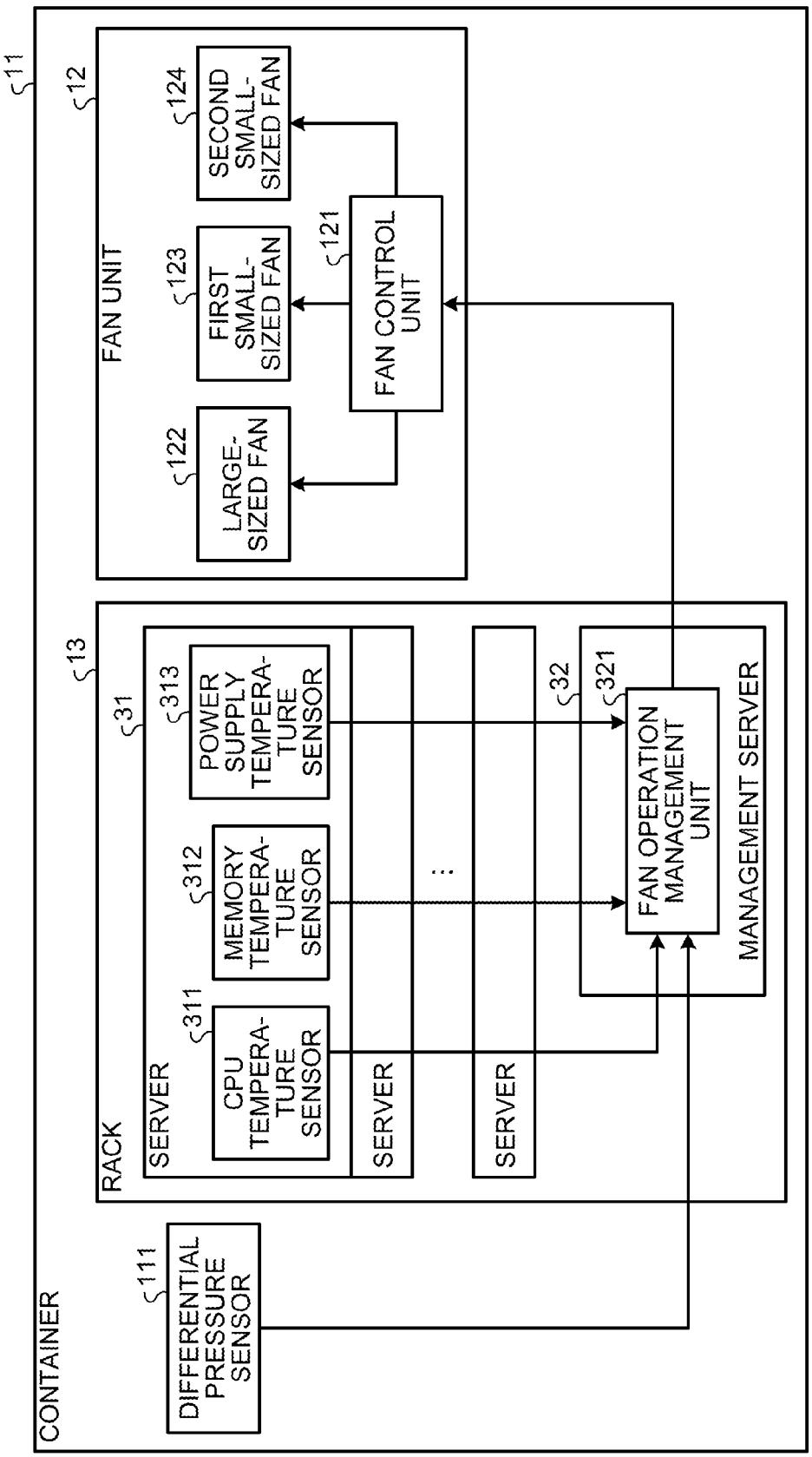
FIG. 11 is a block diagram of a container-type data center according to a second embodiment.

FIG. 11 is a block diagram of a container-type data center according to a second embodiment. The container-type data center 1 according to the second embodiment uses the temperatures of the memory and the power supply in addition to the CPU temperature as a basis for controlling the number of revolutions of the fan. FIG. 1 also illustrates a schematic configuration of the container-type data center 1 according to the second embodiment. In FIG. 11, each component having the same reference numeral as that in FIG. 2 has the same function as in FIG. 2 unless otherwise described.

The server 31 mounted in the container-type data center 1 according to the second embodiment includes a memory temperature sensor 312 and a power supply temperature sensor 313 mounted therein.

The memory temperature sensor 312 measures the memory temperature that is the temperature of the memory included in the server 31, and outputs the measured memory temperature to the fan operation management unit 321.

The power supply temperature sensor 313 measures the power supply temperature that is the temperature in the vicinity of the power supply included in the server 31, and outputs the measured power supply temperature to the fan operation management unit 321.

Figure 12:
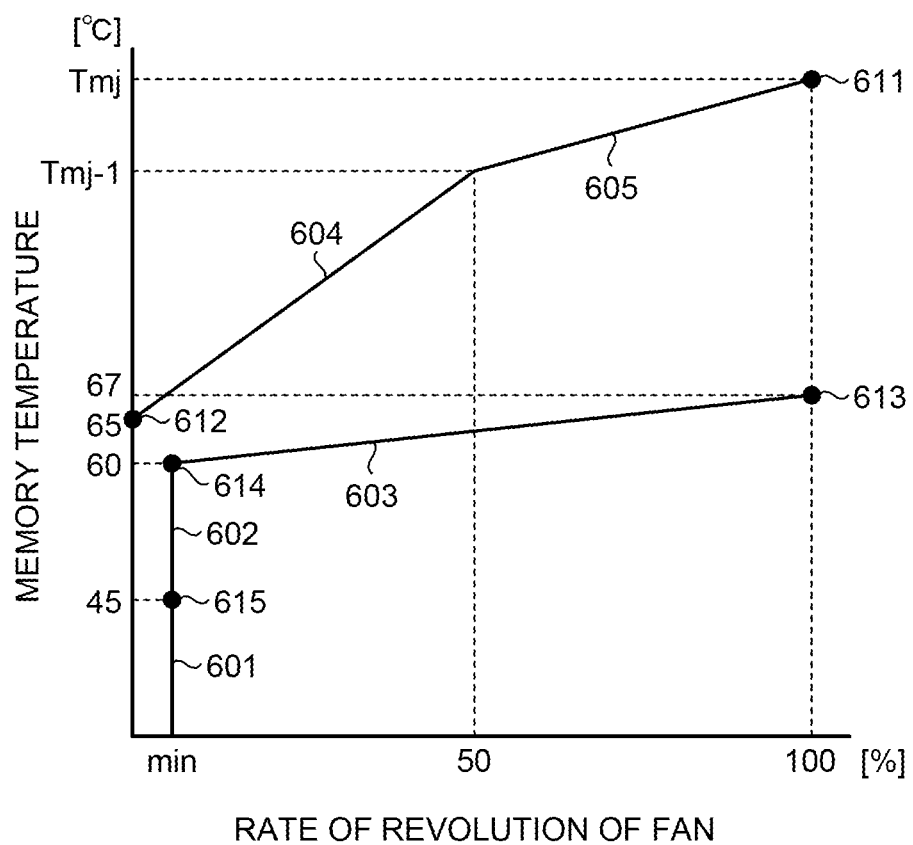
FIG. 12 illustrates a relation between a memory temperature and the duty ratio.

Herein, the duty ratio corresponding to the memory temperature will be described. FIG. 12 illustrates a relation between the memory temperature and the duty ratio.

The operating points of the large-sized fan 122, the first small-sized fan 123, and the second small-sized fan 124 are the same as the operating points A to E in FIG. 7.

Therefore, as in the case of CPU temperature, when the memory temperature is less than 45° C., it is preferred that the volume of air is the one at the operating point E. That is, as the volume of air at a point 615, the volume of air at the operating point E is requested. When the memory temperature is 45° C. or more and less than 60° C., it is preferred that the volume of air is the one at the operating point D. That is, as the volume of air at a point 614, the volume of air at the operating point D is requested. When the memory temperature is 67° C., it is preferred that the volume of air is the one at the operating point C. That is, as the volume of air at a point 613, the volume of air at the operating point C is requested. Therefore, the first small-sized fan 123 and the second small-sized fan 124 are preferably controlled so that the duty ratio varies as represented by graphs 601 to 603 in FIG. 12. The point 615 is a switching point between the volume of air at the operating point E and the volume of air at the operating point D. Preferably, the duty ratio of the first small-sized fan 123 and the second small-sized fan 124 is gradually changed from the point 614 to the point 613 as represented by the graph 603 so as to obtain the volume of air at the operating point C at 67° C. When the memory temperature is 67° C. or more, the first small-sized fan 123 and the second small-sized fan 124 are preferably stopped.

When the memory temperature is 65° C., it is preferred that the volume of air is the one at the operating point B. That is, as the volume of air at a point 612, the volume of air at the operating point B is requested. When the memory temperature is Tmj that is the upper limit value, it is preferred that the volume of air is the one at the operating point A. That is, as the volume of air at a point 611, the volume of air at the operating point A is requested. However, it is preferred that the duty ratio of 50% is obtained at Tmj–10° C. Therefore, the large-sized fan 122 is preferably controlled so that the duty ratio varies as represented by graphs 604 and 605 in FIG. 8.

A fan control table 600 for the memory temperature in FIG. 13 is a table created to implement the operation of the large-sized fan 122, the first small-sized fan 123, and the second small-sized fan 124 illustrated in FIG. 12. FIG. 13 illustrates an example of a fan control table based on the memory temperatures. The fan control table 600 is a table when Tmj is 103° C. In the fan control table 600, the control is described being divided at Tmj–20° C. so that the control of fan in a case of Tmj–20° C. is clearly described. However, in the second embodiment, it is possible that the control division at Tmj–20° C. in the fan control table 600 is not used.

According to the second embodiment, the memory temperature of 45° C. is an example of a "first threshold", 60° C. is an example of a "second threshold", 65° C. is an example of a "third threshold", 67° C. is an example of a "fourth threshold", and 103° C. is an example of a "fifth threshold".

Figures 14, 15:
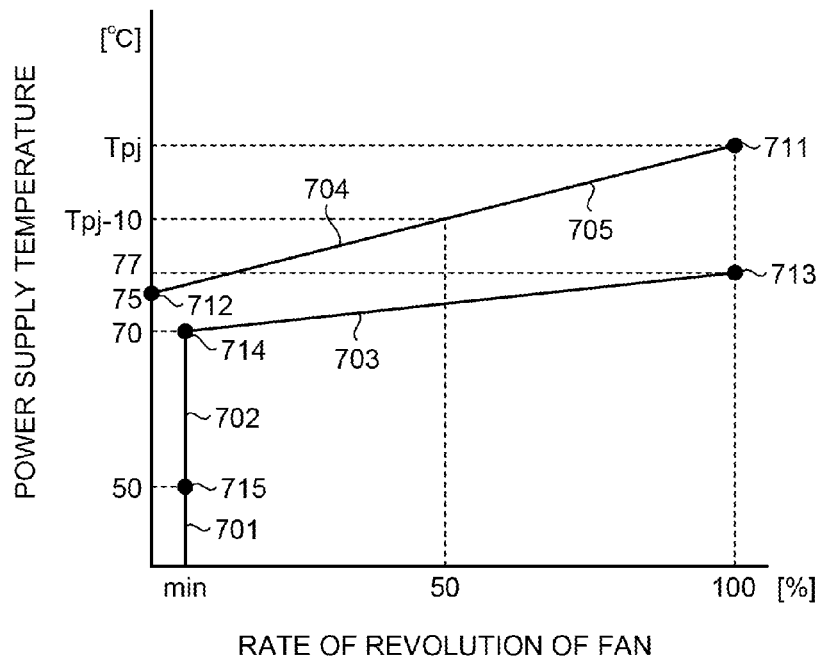
FIG. 14 illustrates a relation between a power supply temperature and the duty ratio.
FIG. 15 illustrates an example of a fan control table based on the power supply temperature.

Next, the duty ratio corresponding to the power supply temperature will be described. FIG. 14 illustrates a relation between the power supply temperature and the duty ratio.

The operating points of the large-sized fan 122, the first small-sized fan 123, and the second small-sized fan 124 are the same as the operating points A to E in FIG. 7.

Next, the control of the fans according to the power supply temperature will be described. When the power supply temperature is less than 50° C., it is preferred that the volume of air is the one at the operating point E. When the power supply temperature is 50° C. or more and less than 70° C., it is preferred that the volume of air is the one at the operating point D. That is, as the volume of air at a point 714, the volume of air at the operating point D is requested. When the power supply temperature is 77° C., it is preferred that the volume of air is the one at the operating point C. That is, as the volume of air at a point 713, the volume of air at the operating point C is requested. Therefore, the first small-sized fan 123 and the second small-sized fan 124 are preferably controlled so that the duty ratio varies as represented by graphs 701 to 703 in FIG. 14. A point 715 is a switching point between the volume of air at the operating point E and the volume of air at the operating point D. Preferably, the duty ratio of the first small-sized fan 123 and the second small-sized fan 124 is changed as represented by the graph 703 so as to obtain the volume of air at the operating point C at 77° C. When the power supply temperature is 67° C. or more, the first small-sized fan 123 and the second small-sized fan 124 are preferably stopped.

When the power supply temperature is 75° C., it is preferred that the volume of air is the one at the operating point B. That is, as the volume of air at a point 712, the volume of air at the operating point B is requested. When the memory temperature is Tp that is the upper limit value, it is preferred that the volume of air is the one at the operating point A. That is, as the volume of air at a point 711, the volume of air at the operating point A is requested. However, it is preferred that the duty ratio of 50% is obtained at Tpj–10° C. Therefore, the large-sized fan 122 is preferably controlled so that the duty ratio varies as represented by graphs 704 and 705 in FIG. 14.

A fan control table 700 for the power supply temperature in FIG. 15 is a table created to implement the operation of the large-sized fan 122, the first small-sized fan 123, and the second small-sized fan 124 illustrated in FIG. 14. FIG. 15 illustrates an example of the fan control table based on the power supply temperatures. The fan control table 700 is a table when Tpj is 95° C.

According to the second embodiment, the power supply temperature of 50° C. is an example of a "first threshold", 70° C. is an example of a "second threshold", 75° C. is an example of a "third threshold", 77° C. is an example of a "fourth threshold", and 95° C. is an example of a "fifth threshold".

The description returns to FIG. 11. The fan operation management unit 321 stores therein the fan control table 500 for the CPU temperature, the fan control table 600 for the memory temperature, and the fan control table 700 for the power supply temperature.

The fan operation management unit 321 receives an input of the CPU temperatures from the CPU temperature sensor 311. Then the fan operation management unit 321 extracts the maximum CPU temperature from among the received CPU temperatures.

The fan operation management unit 321 receives an input of the memory temperatures from the memory temperature sensor 312. Then the fan operation management unit 321 extracts the maximum memory temperature from among the received memory temperatures.

The fan operation management unit 321 receives an input of the power supply temperatures from the power supply temperature sensor 313. Then the fan operation management unit 321 extracts the maximum power supply temperature from among the received power supply temperatures.

Next, the fan operation management unit 321 calculates the numbers of revolutions of the fans in a case in which the fans are operated based on the fan control tables 500 to 700 according to the extracted CPU temperature, memory temperature, and power supply temperature. The fan operation management unit 321 identifies one of the CPU temperature, the memory temperature, and the power supply temperature, based on which the fans are controlled to have the largest numbers of revolutions. Then the fan operation management unit 321 determines the duty ratios of the large-sized fan 122, the first small-sized fan 123, and the second small-sized fan 124 by referring to the fan control table corresponding to the identified temperature. After that, the fan operation management unit 321 notifies the fan control unit 121 of the determined duty ratios.

Figure 16:
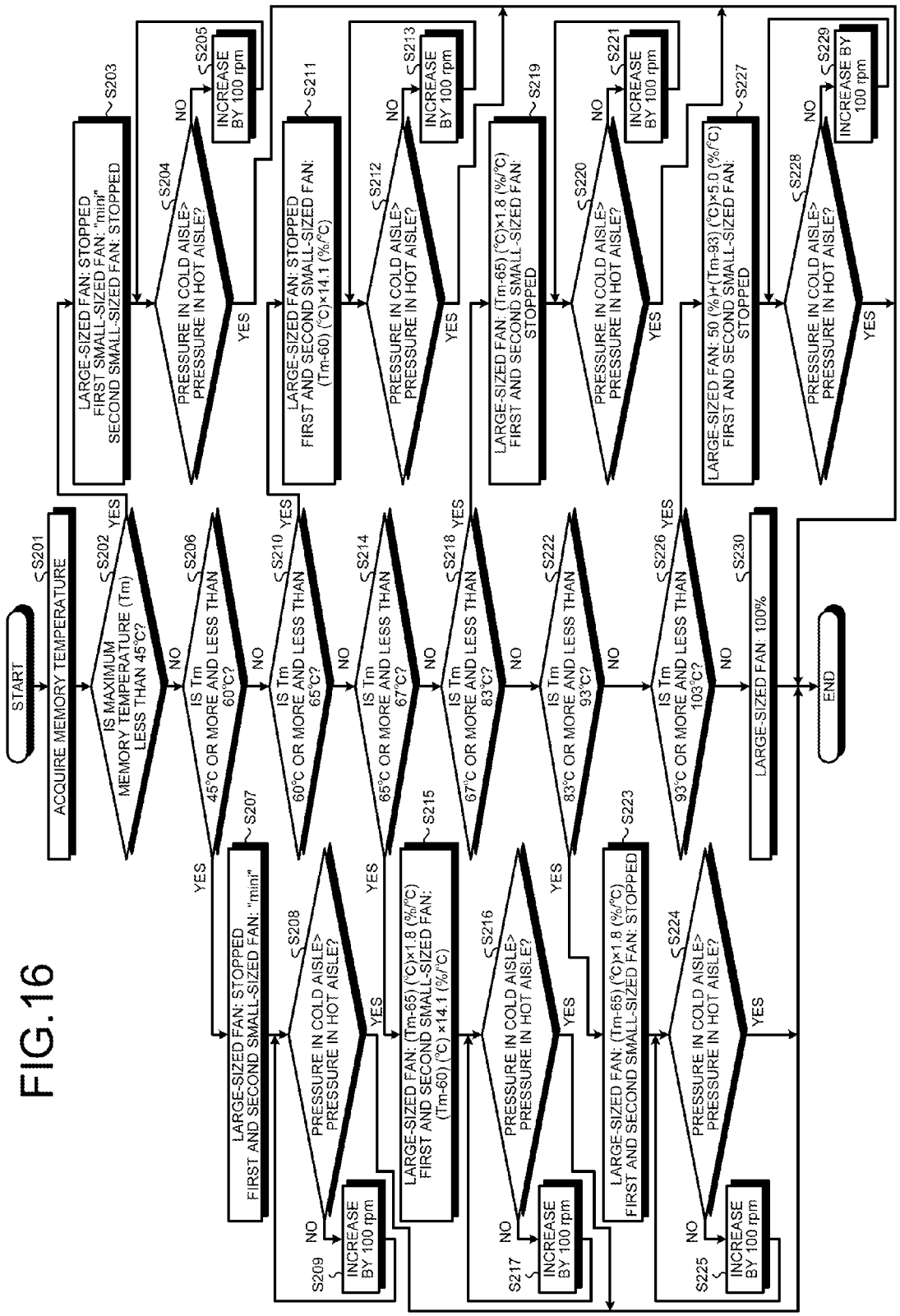
FIG. 16 is a flowchart of control of the fans based on the memory temperature in the container-type data center according to the second embodiment.

The following describes again the procedure of the control of the fans based on the memory temperature in the container-type data center according to the second embodiment with reference to FIG. 16. FIG. 16 is a flowchart of the control of the fans based on the memory temperature in the container-type data center according to the second embodiment. As described above, a pulse is transmitted to rotate each fan according to the duty ratio determined by the fan operation management unit 321. However, for the sake of convenience, the description below is made hereinafter assuming that the fan operation management unit 321 rotates each fan. Herein, described is a case in which the fan operation management unit 321 makes fine adjustment to the number of revolutions of the fan based on the differential pressure between the cold aisle and the hot aisle, in addition to the control of the number of revolutions of the fan by referring to the fan control table 600.

The fan operation management unit 321 acquires the memory temperatures from the memory temperature sensor 312 (Step S201). Then the fan operation management unit 321 selects the maximum memory temperature (Tm) from among the acquired memory temperatures.

The fan operation management unit 321 determines whether Tm is less than 45° C. (Step S202). When Tm is less than 45° C. (Yes at Step S202), the fan operation management unit 321 determines to stop the large-sized fan 122 and the second small-sized fan 124. In addition, the fan operation management unit 321 rotates the first small-sized fan 123 at the duty ratio of "mini" (Step S203).

The fan operation management unit 321 acquires the differential pressure between the cold aisle and the hot aisle from the differential pressure sensor 111, and determines whether the pressure in the cold aisle is higher than the pressure in the hot aisle (Step S204). When the pressure in the cold aisle is equal to or lower than the pressure in the hot aisle (No at Step S204), the fan operation management unit 321 increases the number of revolutions of the first small-sized fan 123 by 100 rpm (Step S205). Thereafter, the fan operation management unit 321 returns to Step S204. In contrast, when the pressure in the cold aisle is higher than the pressure in the hot aisle (Yes at Step S204), the fan operation management unit 321 finishes the control of the fans.

When Tm is 45° C. or more (No at Step S202), the fan operation management unit 321 determines whether Tm is 45° C. or more and less than 60° C. (Step S206). When Tm is 45° C. or more and less than 60° C. (Yes at Step S206), the fan operation management unit 321 determines to stop the large-sized fan 122. In addition, the fan operation management unit 321 rotates the first small-sized fan 123 and the second small-sized fan 124 at the duty ratio of "mini" (Step S207).

The fan operation management unit 321 acquires the differential pressure between the cold aisle and the hot aisle from the differential pressure sensor 111, and determines whether the pressure in the cold aisle is higher than the pressure in the hot aisle (Step S208). When the pressure in the cold aisle is equal to or lower than the pressure in the hot aisle (No at Step S208), the fan operation management unit 321 increases the number of revolutions of the first small-sized fan 123 and the second small-sized fan 124 by 100 rpm (Step S209). Thereafter, the fan operation management unit 321 returns to Step S208. In contrast, when the pressure in the cold aisle is higher than the pressure in the hot aisle (Yes at Step S208), the fan operation management unit 321 finishes the control of the fans.

When Tm is 60° C. or more (No at Step S206), the fan operation management unit 321 determines whether Tm is 60° C. or more and less than 65° C. (Step S210). When Tm is 60° C. or more and less than 65° C. (Yes at Step S210), the fan operation management unit 321 determines to stop the large-sized fan 122. In addition, the fan operation management unit 321 rotates the first small-sized fan 123 and the second small-sized fan 124 at the duty ratio of (Tm−60)×14.1 (Step S211).

The fan operation management unit 321 acquires the differential pressure between the cold aisle and the hot aisle from the differential pressure sensor 111, and determines whether the pressure in the cold aisle is higher than the pressure in the hot aisle (Step S212). When the pressure in the cold aisle is equal to or lower than the pressure in the hot aisle (No at Step S212), the fan operation management unit 321 increases the number of revolutions of the first small-sized fan 123 and the second small-sized fan 124 by 100 rpm (Step S213). Thereafter, the fan operation management unit 321 returns to Step S212. In contrast, when the pressure in the cold aisle is higher than the pressure in the hot aisle (Yes at Step S212), the fan operation management unit 321 finishes the control of the fans.

When Tm is 65° C. or more (No at Step S210), the fan operation management unit 321 determines whether Tm is 65° C. or more and less than 67° C. (Step S214). When Tm is 65° C. or more and less than 67° C. (Yes at Step S214), the fan operation management unit 321 rotates the large-sized fan 122 at the duty ratio of (Tm−65)×1.8. In addition, the fan operation management unit 321 rotates the first small-sized fan 123 and the second small-sized fan 124 at the duty ratio of (Tm−60)×14.1 (Step S215).

The fan operation management unit 321 acquires the differential pressure between the cold aisle and the hot aisle from the differential pressure sensor 111, and determines whether the pressure in the cold aisle is higher than the pressure in the hot aisle (Step S216). When the pressure in the cold aisle is equal to or lower than the pressure in the hot aisle (No at Step S216), the fan operation management unit 321 increases the number of revolutions of the large-sized fan 122, the first small-sized fan 123, and the second small-sized fan 124 by 100 rpm (Step S217). Thereafter, the fan operation management unit 321 returns to Step S216. In contrast, when the pressure in the cold aisle is higher than the pressure in the hot aisle (Yes at Step S216), the fan operation management unit 321 finishes the control of the fans.

When Tm is 67° C. or more (No at Step S214), the fan operation management unit 321 determines whether Tm is 67° C. or more and less than 83° C. (Step S218). When Tm is 67° C. or more and less than 83° C. (Yes at Step S218), the fan operation management unit 321 rotates the large-sized fan 122 at the duty ratio of (Tm−65)×1.8. In addition, the fan operation management unit 321 stops the first small-sized fan 123 and the second small-sized fan 124 (Step S219).

The fan operation management unit 321 acquires the differential pressure between the cold aisle and the hot aisle from the differential pressure sensor 111, and determines whether the pressure in the cold aisle is higher than the pressure in the hot aisle (Step S220). When the pressure in the cold aisle is equal to or lower than the pressure in the hot aisle (No at Step S220), the fan operation management unit 321 increases the number of revolutions of the large-sized fan 122 by 100 rpm (Step S221). Thereafter, the fan operation management unit 321 returns to Step S220. In contrast, when the pressure in the cold aisle is higher than the pressure in the hot aisle (Yes at Step S220), the fan operation management unit 321 finishes the control of the fans.

When Tm is 83° C. or more (No at Step S218), the fan operation management unit 321 determines whether Tm is 83° C. or more and less than 93° C. (Step S222). When Tm is 83° C. or more and less than 93° C. (Yes at Step S222), the fan operation management unit 321 rotates the large-sized fan 122 at the duty ratio of (Tm−65)×1.8. In addition, the fan operation management unit 321 stops the first small-sized fan 123 and the second small-sized fan 124 (Step S223).

The fan operation management unit 321 acquires the differential pressure between the cold aisle and the hot aisle from the differential pressure sensor 111, and determines whether the pressure in the cold aisle is higher than the pressure in the hot aisle (Step S224). When the pressure in the cold aisle is equal to or lower than the pressure in the hot aisle (No at Step S224), the fan operation management unit 321 increases the number of revolutions of the large-sized fan 122 by 100 rpm (Step S225). Thereafter, the fan operation management unit 321 returns to Step S224. In contrast, when the pressure in the cold aisle is higher than the pressure in the hot aisle (Yes at Step S224), the fan operation management unit 321 finishes the control of the fans.

When Tm is 93° C. or more (No at Step S222), the fan operation management unit 321 determines whether Tm is 93° C. or more and less than 103° C. (Step S226). When Tm is 93° C. or more and less than 103° C. (Yes at Step S226), the fan operation management unit 321 rotates the large-sized fan 122 at the duty ratio of 50+(Tm−93)×5.0. In addition, the fan operation management unit 321 stops the first small-sized fan 123 and the second small-sized fan 124 (Step S227).

The fan operation management unit 321 acquires the differential pressure between the cold aisle and the hot aisle from the differential pressure sensor 111, and determines whether the pressure in the cold aisle is higher than the pressure in the hot aisle (Step S228). When the pressure in the cold aisle is equal to or lower than the pressure in the hot aisle (No at Step S228), the fan operation management unit 321 increases the number of revolutions of the large-sized fan 122 by 100 rpm (Step S229). Thereafter, the fan operation management unit 321 returns to Step S228. In contrast, when the pressure in the cold aisle is higher than the pressure in the hot aisle (Yes at Step S228), the fan operation management unit 321 finishes the control of the fans.

When T is 103° C. or more (No at Step S226), the fan operation management unit 321 rotates the large-sized fan 122 at the duty ratio of 100 (Step S230). Accordingly, the fan operation management unit 321 finishes the control of the fans.

Figure 17:
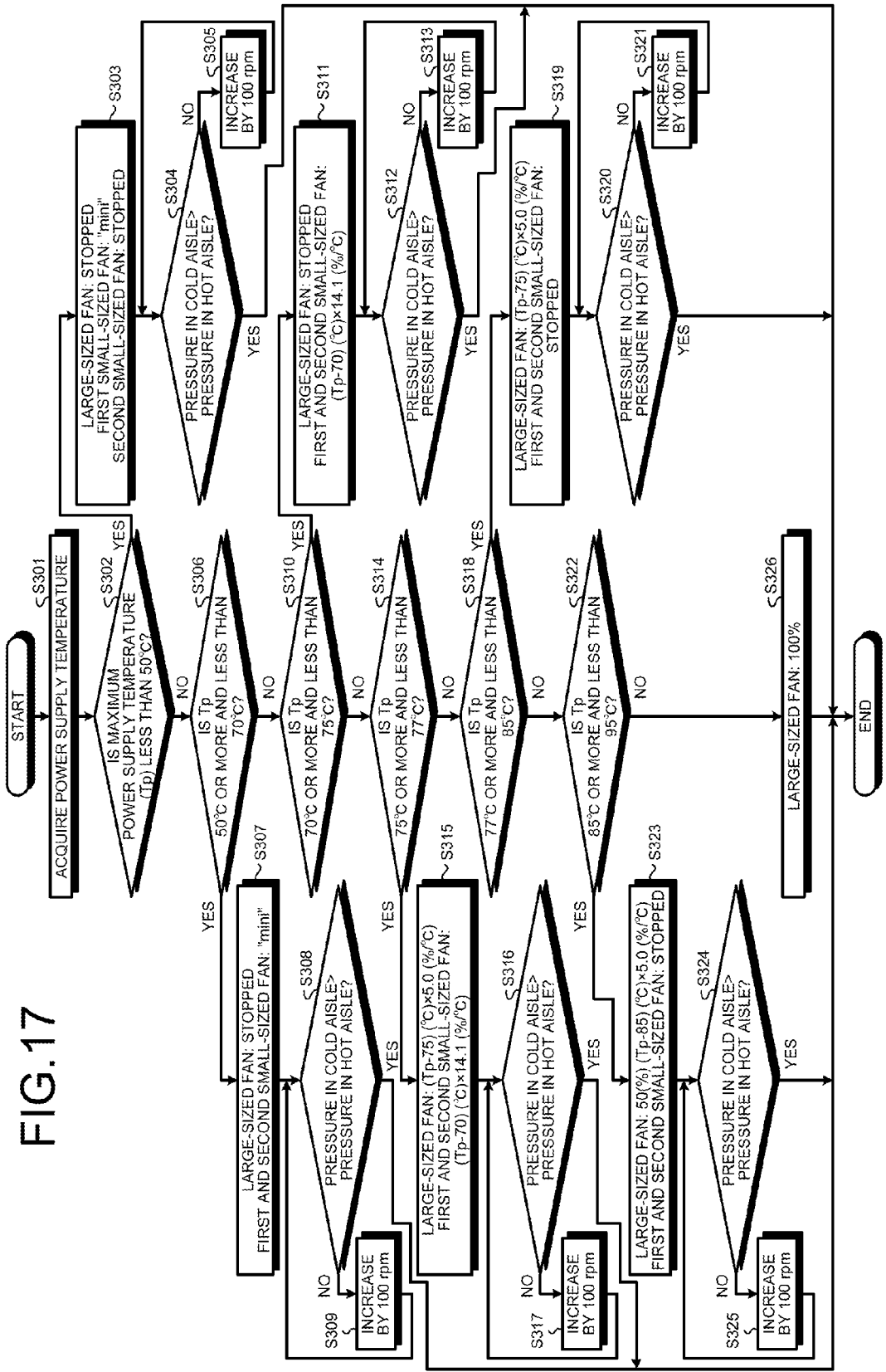
FIG. 17 is a flowchart of the control of the fans based on the power supply temperature in the container-type data center according to the second embodiment.

The following describes again the procedure of the control of the fans based on the power supply temperature in the container-type data center according to the second embodiment with reference to FIG. 17. FIG. 17 is a flowchart of the control of the fans based on the power supply temperature in the container-type data center according to the second embodiment. As described above, a pulse is transmitted to rotate each fan according to the duty ratio determined by the fan operation management unit 321. However, for the sake of convenience, description is made hereinafter assuming that the fan operation management unit 321 rotates each fan. Herein, described is a case in which the fan operation management unit 321 makes fine adjustment to the number of revolutions of the fan based on the differential pressure between the cold aisle and the hot aisle, in addition to the control of the number of revolutions of the fan by referring to the fan control table 700.

The fan operation management unit 321 acquires the power supply temperatures from the power supply temperature sensor 313 (Step S301). Then the fan operation management unit 321 selects the maximum power supply temperature (Tp) from among the acquired memory temperatures.

The fan operation management unit 321 determines whether Tp is less than 50° C. (Step S302). When Tp is less than 50° C. (Yes at Step S302), the fan operation management unit 321 determines to stop the large-sized fan 122 and the second small-sized fan 124. In addition, the fan operation management unit 321 rotates the first small-sized fan 123 at the duty ratio of "mini" (Step S303).

The fan operation management unit 321 acquires the differential pressure between the cold aisle and the hot aisle from the differential pressure sensor 111, and determines whether the pressure in the cold aisle is higher than the pressure in the hot aisle (Step S304). When the pressure in the cold aisle is equal to or lower than the pressure in the hot aisle (No at Step S304), the fan operation management unit 321 increases the number of revolutions of the first small-sized fan 123 by 100 rpm (Step S305). Thereafter, the fan operation management unit 321 returns to Step S304. In contrast, when the pressure in the cold aisle is higher than the pressure in the hot aisle (Yes at Step S304), the fan operation management unit 321 finishes the control of the fans.

When Tp is 50° C. or more (No at Step S302), the fan operation management unit 321 determines whether Tp is 50° C. or more and less than 70° C. (Step S306). When Tp is 50° C. or more and less than 70° C. (Yes at Step S306), the fan operation management unit 321 determines to stop the large-sized fan 122. In addition, the fan operation management unit 321 rotates the first small-sized fan 123 and the second small-sized fan 124 at the duty ratio of "mini" (Step S307).

The fan operation management unit 321 acquires the differential pressure between the cold aisle and the hot aisle from the differential pressure sensor 111, and determines whether the pressure in the cold aisle is higher than the pressure in the hot aisle (Step S308). When the pressure in the cold aisle is equal to or lower than the pressure in the hot aisle (No at Step S308), the fan operation management unit 321 increases the number of revolutions of the first small-sized fan 123 and the second small-sized fan 124 by 100 rpm (Step S309). Thereafter, the fan operation management unit 321 returns to Step S308. In contrast, when the pressure in the cold aisle is higher than the pressure in the hot aisle (Yes at Step S308), the fan operation management unit 321 finishes the control of the fans.

When Tp is 70° C. or more (No at Step S306), the fan operation management unit 321 determines whether Tp is 70° C. or more and less than 75° C. (Step S310). When Tp is 70° C. or more and less than 75° C. (Yes at Step S310), the fan operation management unit 321 determines to stop the large-sized fan 122. In addition, the fan operation management unit 321 rotates the first small-sized fan 123 and the second small-sized fan 124 at the duty ratio of (Tp−70)×14.1 (Step S311).

The fan operation management unit 321 acquires the differential pressure between the cold aisle and the hot aisle from the differential pressure sensor 111, and determines whether the pressure in the cold aisle is higher than the pressure in the hot aisle (Step S312). When the pressure in the cold aisle is equal to or lower than the pressure in the hot aisle (No at Step S312), the fan operation management unit 321 increases the number of revolutions of the first small-sized fan 123 and the first small-sized fan 124 by 100 rpm (Step S313). Thereafter, the fan operation management unit 321 returns to Step S312. In contrast, when the pressure in the cold aisle is higher than the pressure in the hot aisle (Yes at Step S312), the fan operation management unit 321 finishes the control of the fans.

When Tp is 75° C. or more (No at Step S310), the fan operation management unit 321 determines whether Tp is 75° C. or more and less than 77° C. (Step S314). When Tp is 75° C. or more and less than 77° C. (Yes at Step S314), the fan operation management unit 321 rotates the large-sized fan 122 at the duty ratio of (Tp−75)×5.0. In addition, the fan operation management unit 321 rotates the first small-sized fan 123 and the second small-sized fan 124 at the duty ratio of (Tp−70)×14.1 (Step S315).

The fan operation management unit 321 acquires the differential pressure between the cold aisle and the hot aisle from the differential pressure sensor 111, and determines whether the pressure in the cold aisle is higher than the pressure in the hot aisle (Step S316). When the pressure in the cold aisle is equal to or lower than the pressure in the hot aisle (No at Step S316), the fan operation management unit 321 increases the number of revolutions of the large-sized fan 122, the first small-sized fan 123, and the second small-sized fan 124 by 100 rpm (Step S317). Thereafter, the fan operation management unit 321 returns to Step S316. In contrast, when the pressure in the cold aisle is higher than the pressure in the hot aisle (Yes at Step S316), the fan operation management unit 321 finishes the control of the fans.

When Tp is 77° C. or more (No at Step S314), the fan operation management unit 321 determines whether Tp is 77° C. or more and less than 85° C. (Step S318). When Tp is 77° C. or more and less than 85° C. (Yes at Step S318), the fan operation management unit 321 rotates the large-sized fan 122 at the duty ratio of (Tp−75)×5.0. In addition, the fan operation management unit 321 stops the first small-sized fan 123 and the second small-sized fan 124 (Step S319).

The fan operation management unit 321 acquires the differential pressure between the cold aisle and the hot aisle from the differential pressure sensor 111, and determines whether the pressure in the cold aisle is higher than the pressure in the hot aisle (Step S320). When the pressure in the cold aisle is equal to or lower than the pressure in the hot aisle (No at Step S320), the fan operation management unit 321 increases the number of revolutions of the large-sized fan 122 by 100 rpm (Step S321). Thereafter, the fan operation management unit 321 returns to Step S320. In contrast, when the pressure in the cold aisle is higher than the pressure in the hot aisle (Yes at Step S320), the fan operation management unit 321 finishes the control of the fans.

When Tp is 85° C. or more (No at Step S318), the fan operation management unit 321 determines whether Tp is 85° C. or more and less than 95° C. (Step S322). When Tp is 85° C. or more and less than 95° C. (Yes at Step S322), the fan operation management unit 321 rotates the large-sized fan 122 at the duty ratio of 50+(Tp−85)×5.0. In addition, the fan operation management unit 321 stops the first small-sized fan 123 and the second small-sized fan 124 (Step S323).

The fan operation management unit 321 acquires the differential pressure between the cold aisle and the hot aisle from the differential pressure sensor 111, and determines whether the pressure in the cold aisle is higher than the pressure in the hot aisle (Step S324). When the pressure in the cold aisle is equal to or lower than the pressure in the hot aisle (No at Step S324), the fan operation management unit 321 increases the number of revolutions of the large-sized fan 122 by 100 rpm (Step S325). Thereafter, the fan operation management unit 321 returns to Step S324. In contrast, when the pressure in the cold aisle is higher than the pressure in the hot aisle (Yes at Step S324), the fan operation management unit 321 finishes the control of the fans.

When Tp is 95° C. or more (No at Step S322), the fan operation management unit 321 rotates the large-sized fan 122 at the duty ratio of 100 (Step S326). Accordingly, the fan operation management unit 321 finishes the control of the fans.

The fan operation management unit 321 determines a piece of information to be used as a basis of the control of the fans among the CPU temperature, the memory temperature, and the power supply temperature. Thereafter, the fan operation management unit 321 performs a process of the procedure corresponding to the determined piece of information among the procedures in FIGS. 9, 16, and 17 to control the fans. The fan operation management unit 321 periodically repeats the determination of the basis and the processing of the control of the fans based on the determined basis at 2-second intervals, for example.

As described above, the container-type data center according to the second embodiment performs the control of the fans based on the CPU temperature, the memory temperature, and the power supply temperature. Accordingly, more appropriate control of the fans can be performed, thereby reliably decreasing the temperature of the server while reducing the power consumption.

In the above embodiments, the description is made such that the second small-sized fan 124 stops and only the first small-sized fan 123 rotates when the CPU temperature is less than 45° C. This means that any one of the first small-sized fan 123 and the second small-sized fan 124 that are aligned to each other operates preferably. For example, when the CPU temperature is less than 45° C., only the second small-sized fan 124 may operate. In addition, the first small-sized fan 123 and the second small-sized fan 124 that are aligned to each other are assumed to be one set, the fan operation management unit 321 may perform control so as to suitably select to rotate any one of the first small-sized fan 123 and the second small-sized fan 124 in each set.

In the above embodiment, the fan operation management unit 321 performs control so that the pressure in the cold aisle is even a little higher than the pressure in the hot aisle as a control based on a differential pressure. However, if the pressure in the cold aisle is higher than the pressure in the hot aisle, other control may be performed. For example, the fan operation management unit 321 may perform control so that the pressure in the cold aisle is higher than the pressure in the hot aisle by 1 to 5 Pa. In this manner, the container-type data center may keep the pressure on the cold aisle side higher than the pressure on the hot aisle side more reliably.

Hardware Configuration

Figure 18:
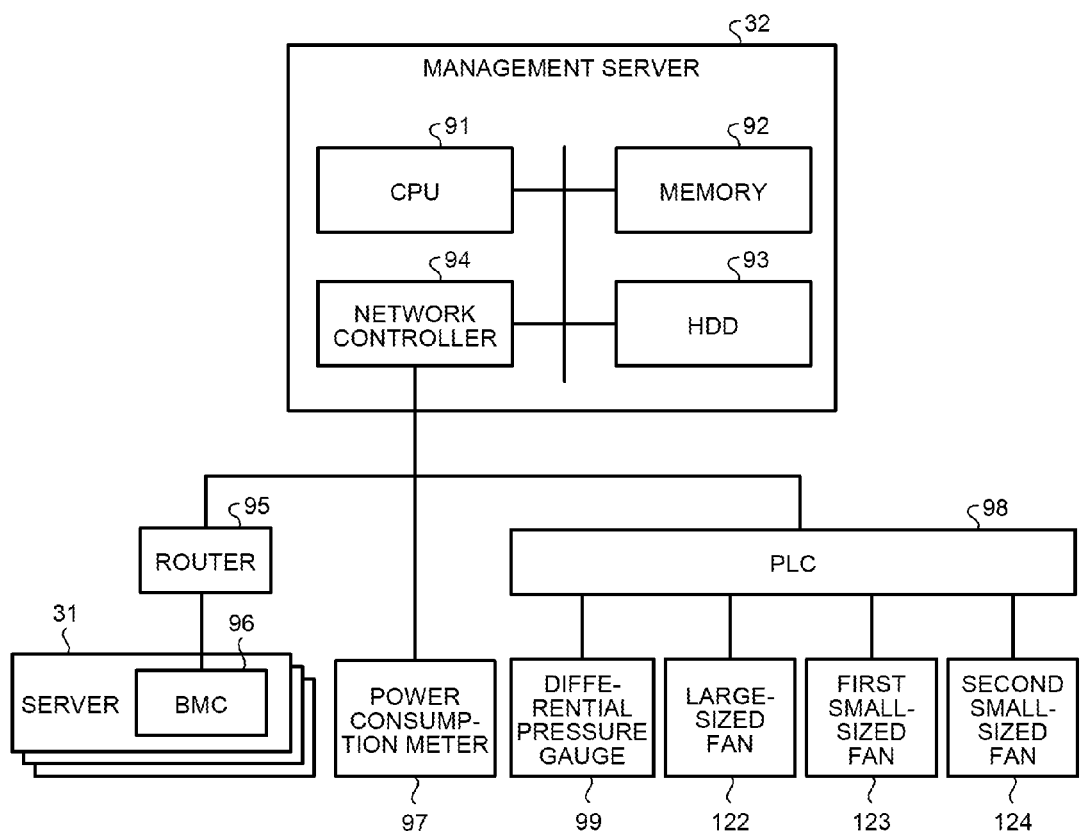
FIG. 18 is a hardware configuration diagram of the inside of the container-type data center.

FIG. 18 is a hardware configuration diagram of the inside of the container-type data center.

As illustrated in FIG. 18, the container-type data center includes the server 31, the management server 32, a router 95, a power consumption meter 97, a programmable logic controller (PLC) 98, a differential pressure gauge 99, the large-sized fan 122, the first small-sized fan 123, and the second small-sized fan 124.

The management server 32 includes a CPU 91, a memory 92, a hard disk drive (HDD) 93, and a network controller 94. The memory 92, the HDD 93, and the network controller 94 are connected to the CPU 91 via a bus.

The network controller 94 is a network interface to an external device and is connected to the server 31 by a management LAN (Local Area Network) via the router 95.

The network controller 94 receives the CPU temperature, the memory temperature, and the power supply temperature of the server 31 by the IPMI and the like via the router 95. The network controller 94 acquires the power consumption of the server 31 and the power consumption of the large-sized fan 122, the first small-sized fan 123, and the second small-sized fan 124 from the power consumption meter 97 with the SNMP. The network controller 94 acquires information about the differential pressure between the cold aisle and the hot aisle from the PLC 98 with the Transmission Control Protocol-Internet Protocol (TCP-IP). In addition, the network controller 94 transmits the duty ratios of the large-sized fan 122, the first small-sized fan 123, and the second small-sized fan 124 to the PLC 98 with the TCP-IP.

The HDD 93 stores therein various programs such as a program for implementing the function of the fan operation management unit 321.

The CPU 91 and the memory 92 implement the function of the fan operation management unit 321 exemplified in FIGS. 5 and 11. For example, the CPU 91 generates and performs a process for reading various programs from the HDD 93, loading the programs on the memory 92, and implementing the function of the fan operation management unit 321.

The server 31 includes a baseboard management controller (BMC) 96. The BMC 96 collects pieces of information from various temperature sensors, and transmits the pieces of information to the management server 32 via the router 95.

The PLC 98 implements the function of the fan control unit 121. Specifically, the PLC 98 acquires the duty ratio of each fan transmitted from the management server 32. The PLC 98 transmits pulses to the large-sized fan 122, the first small-sized fan 123, and the second small-sized fan 124 according to the specified duty ratios, and controls the numbers of revolutions. In addition, the PLC 98 receives information of the differential pressure between the cold aisle and the hot aisle from the differential pressure gauge 99 and transmits the information of the differential pressure to the management server 32.

The differential pressure gauge 99 measures the pressure in the cold aisle and the pressure in the hot aisle, and calculates a difference therebetween to obtain a differential pressure. Then the differential pressure gauge 99 transmits the obtained differential pressure between the cold aisle and the hot aisle to the PLC 98.

The power consumption meter 97 is disposed in the power panel 18 in FIG. 1 and the like. The power consumption meter 97 monitors a supply feeder and the like to each component, and measures the power consumption of the server 31, the large-sized fan 122, the first small-sized fan 123, and the second small-sized fan 124. The power consumption meter 97 outputs the measured power consumption to the management server 32.

In the embodiments described above, the control of the fans based on the power consumption is not performed. However, the management server 32 may use the power consumption of each component received from the power consumption meter 97 for the control of the fans.

An aspect of a container-type data center and a method for controlling a container-type data center disclosed herein has an advantageous effect of reducing power consumption due to the driving of a fan.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A container-type data center comprising:
    a container;
    a rack that is included in the container and incorporates electronic equipment;
    a fan device that is included in the container and includes a plurality of first fans and a plurality of second fans of which diameter is smaller than the diameter of the first fans, the first fans being disposed on a line which is a vertical direction line with respect to a ground, two said second fans being disposed in a direction perpendicular to the line of the first fans and between each of the first fans, the first fans and the second fans being alternately arranged on an opposing surface opposed to the rack;
    a temperature measurement unit that measures a temperature of a heat generation component incorporated in the electronic equipment; and
    a control unit that controls rotation of the first fans and rotation of the second fans based on the measured temperature.

2. The container-type data center according to claim 1, wherein the fan device includes a plurality of lines in which the first fans are disposed on the opposing surface.

3. The container-type data center according to claim 1, wherein the two second fans are arranged per each said first fan on the opposing surface of the fan device.

4. The container-type data center according to claim 1, wherein the control unit rotates the first fans when the measured temperature is equal to or more than a predetermined temperature, and rotates the second fans when the measured temperature is less than the predetermined temperature.

5. The container-type data center according to claim 3, wherein
    the control unit stops the first fans and one of the two corresponding second fans and rotates the other one of the second fans when the measured temperature is equal to or less than a first threshold,
    the control unit stops the first fans and rotates the two second fans when the measured temperature is equal to or more than the first threshold and less than a second threshold,
    the control unit stops the first fans and increases the number of revolutions of the two second fans according to the measured temperature when the measured temperature is equal to or more than the second threshold and less than a third threshold,
    the control unit rotates the first fans and increases the number of revolutions of the two second fans according to the measured temperature when the measured temperature is equal to or more than the third threshold and less than a fourth threshold,
    the control unit increases the number of revolutions of the first fans according to the measured temperature and stops the two second fans when the measured temperature is equal to or more than the fourth threshold and less than a fifth threshold, and the control unit rotates the first fans at the maximum number of revolutions when the measured temperature is equal to or more than the fifth threshold.

6. The container-type data center according to claim 1, wherein the rack is provided plurally, and the fan device is arranged opposed to each of the racks.

7. The container-type data center according to claim 1, wherein, when the temperature measurement unit measures temperatures of a plurality of components incorporated in the electronic equipment, the control unit controls the rotation of the first fans and the rotation of the second fans based on the highest temperature among the measured temperatures.

8. A method of controlling a container-type data center that comprises a rack incorporating electronic equipment and a fan device in which a plurality of first fans and a plurality of second fans of which diameter is smaller than the diameter of the first fans are alternately arranged on an opposing surface opposed to the rack, the first fans being disposed on a line which is a vertical direction line with respect to a ground, two said second fans being disposed in a direction perpendicular to the line of the first fans and between each of the first fans, the method comprising:

by a control unit included in the container-type data center, controlling rotation of the first fan and rotation of the second fans based on a measured temperature.

\* \* \* \* \*